United States Patent [19]

Kanda et al.

[11] Patent Number: 4,508,640

[45] Date of Patent: Apr. 2, 1985

[54] ELECTROMAGNETIC WAVE-SHIELDING MATERIALS

[75] Inventors: Masahiro Kanda, Kanagawa; Tetsuya Hatakeyama, Saitama; Yusuke Morito, Kanagawa, all of Japan

[73] Assignee: Showa Denko Kabushiki Kaisha, Tokyo, Japan

[21] Appl. No.: 444,026

[22] Filed: Nov. 23, 1982

[30] Foreign Application Priority Data

| Nov. 24, 1981 | [JP] | Japan | 56-186825 |
| Dec. 9, 1981 | [JP] | Japan | 56-196985 |
| Jan. 7, 1982 | [JP] | Japan | 57-602 |
| Apr. 15, 1982 | [JP] | Japan | 57-61687 |
| Apr. 15, 1982 | [JP] | Japan | 57-61688 |
| Jun. 2, 1982 | [JP] | Japan | 57-93002 |
| Sep. 3, 1982 | [JP] | Japan | 57-152734 |
| Sep. 14, 1982 | [JP] | Japan | 57-158831 |
| Sep. 14, 1982 | [JP] | Japan | 57-158832 |
| Nov. 15, 1982 | [JP] | Japan | 57-199050 |

[51] Int. Cl.$^3$ .................................. H01B 1/06
[52] U.S. Cl. ........................ 252/503; 252/511; 524/495; 524/496; 524/441; 523/137
[58] Field of Search ............... 252/511, 503; 524/495, 524/496, 441, 576; 523/137; 428/412, 474.7, 515, 516

[56] References Cited

U.S. PATENT DOCUMENTS

| 3,468,753 | 9/1969 | Vincent et al. | 252/511 |
| 4,006,114 | 2/1977 | Carlson | 524/411 |
| 4,169,816 | 10/1979 | Tsien | 252/511 |
| 4,234,469 | 11/1980 | Ohta et al. | 524/411 |
| 4,339,374 | 7/1982 | Olschewski et al. | 524/496 |
| 4,395,362 | 7/1983 | Satoh et al. | 252/511 |

FOREIGN PATENT DOCUMENTS

| 062252 | 3/1981 | European Pat. Off. |
| 43925 | 3/1981 | Japan. |

OTHER PUBLICATIONS

"Conductive Composites for EMI Shielding", Battelle Columbus Laboratories, 6-14-78.

Primary Examiner—Josephine L. Barr
Attorney, Agent, or Firm—Sughrue, Mion, Zinn, Macpeak, and Seas

[57] ABSTRACT

An electromagnetic wave-shielding material is disclosed. The material is comprised of one or more electromagnetic wave-shielding layers and one or more surface layers. The shielding layers are comprised of a thermoplastic resin, an aluminum or aluminum alloy and electrically conductive carbon black. The surface layers are comprised substantially of thermoplastic resin. The proportion of the carbon black and aluminum in the shielding layer are from 5 to 50% by volume and 5 to 50% by volume, respectively, provided the total proportion of the carbon black and aluminum is 10 to 60% by volume. The difference in solubility parameter between the thermoplastic resin of the surface layer and the thermoplastic resin of the shielding layer is 3.0 or less. The material has superior mechanical strength and electromagnetic wave-shielding properties.

12 Claims, 7 Drawing Figures

ELECTROMAGNETIC WAVE-SHIELDING MATERIALS

FIELD OF THE INVENTION

The present invention relates to electromagnetic wave-shielding materials having excellent properties with respect to electromagnetic interference. More specifically, the invention relates to an electromagnetic wave-shielding material comprised of one or more electromagnetic wave-shielding layers which include a thermoplastic resin, aluminum, and electrically conductive carbon black and one or more surface layers comprised substantially of a thermoplastic resin.

BACKGROUND OF THE INVENTION

Radiation sources for electromagnetic waves have been increasing in number with continued advances in industrial technology and the general standard of living. The leakage of electromagnetic waves, therefore, has become a significant social problem since the wave can exert adverse influences on the human body. Such leakage may also cause the incorrect behavior of integrated circuits in electronic equipment. In particular, electromagnetic waves radiated from electronic computers and various office equipment exert adverse influences on television sets and audio equipment.

Even in the car industry, electronic devices are now used. For example, they are used in automatic controllers for various machines such as an engine, and further, in a speedometer, a tachometer, and so forth. Several types of cars are now equipped with a microcomputer. In addition, electronic devices such as a telephone, a radio, and a TV set are installed inside cars for the convenience of the driver. However, these electronic devices are liable to suffer from various operational difficulties under the influence of electromagnetic waves emanating from the engine compartment, or from a source outside the car.

Various methods have recently been used to shield such equipment against electromagnetic waves, as described in British Pat. Nos. 1,073,567, 1,168,701, 1,195,076, 1,226,181 and 1,246,829, U.S. Pat. Nos. 3,468,753, 3,491,056, 3,393,257, 3,474,067, 3,668,281, 3,767,613, 4,006,114 and 4,234,469 and French Pat. No. 2,077,021.

In general, since metals can absorb or reflect electromagnetic waves, they are effectively used as shielding materials for electromagnetic waves radiated from an electronic oven and various communication apparatuses. In addition, plastics with metals deposited thereon by vacuum metallizing method or arc spray coating method can be used for the same purpose. Furthermore, materials prepared by adding additives, e.g., carbon powder and metal powder, to plastics can be used.

Using metals alone or other materials coated with metals are disadvantageous in that the specific gravity is large, workability is poor, the procedure of treatment is not simple, and the treatment cost is high. Similarly, a method of introducing additives is disadvantageous in that when these additives are added in small amounts, the effect cannot be exhibited sufficiently. However, when they are added in large amounts, the mechanical strength and workability of the resulting molded article are seriously reduced although the effect can be exhibited.

Plastic molds are provided with a flash sprayed metal layer or an electrically conductive coating layer on the inner surface thereof for the purpose of shielding electromagnetic waves. The flash sprayed metal layer or the electrically conductive coating layer is separated from the plastic mold by the impulsive action of falling bodies. The thus-separated small pieces fall in the plastic mold, causing problems such as the break-down of electric circuits contained in the plastic mold and fire. Furthermore, containers for electronic devices, such as office machines must be flame resistance due to safety requirements. Accordingly, there is a need for a resin composition which is capable of providing a surface layer which is free from the separation and break-down caused by impulses. Further, the material must be flame resistance, have excellent workability, as well as electromagnetic wave-shielding ability.

In general, in order to increase the electromagnetic interference property of synthetic resins or rubbers, it is necessary to incorporate a large amount of electrically conductive carbon black in the resin. However, it is very difficult to provide flame resistance to compositions containing large amounts of carbon black. Even though additives such as halogen-containing organic compounds and antimony oxide are added to provide flame resistance, when the resulting composition is exposed to a flame in accordance with a flame resistance testing method ("UL-94 Method", Underwriter Laboratories, U.S.A.), glowing due to carbonization of the carbon black is vigorous. Furthermore, the flame remains alive for a long period of time, and if other flammable substances are brought into contact with the flame, they will easily catch fire. Even if considerable amounts of flame retarders are added this tendency remains and it is quite difficult to eliminate these defects. Moreover, the addition of such large amounts of flame retarders to compositions with carbon black incorporated thereinto reduces the electromagnetic interference properties since it results in a reduction in the proportion of carbon black, even if flame resistance can be provided. Therefore, it is not possible to obtain a polyolefin composition with good electromagnetic interference properties which also has excellent flame resistance. Furthermore, the use of such large amounts of expensive flame retarders gives rise increased costs. In addition, a molded article prepared from the composition does not have mechanical characteristics which are suitable for practical use.

SUMMARY OF THE INVENTION

The present inventors have carried out extensive investigations to develop electromagnetic wave-shielding materials which are free from the above-described disadvantages and which have excellent properties with respect to electromagnetic interference. As a result of these studies, the electromagnetic wave-shielding material of the present invention was found. The material is comprised of:

(I) at least one electromagnetic wave-shielding layer (hereinafter referred to as "shielding layer") comprised of:
 (A) a thermoplastic resin;
 (B) aluminum or an alloy composed of aluminum in the form of powder, fine fiber and/or flake (hereinafter referred to as "aluminum component"); and
 (C) electrically conductive carbon black; and (II) at least one surface layer composed of a thermoplastic resin,
wherein the proportions of the electrically conductive carbon black and the aluminum component in the shielding layer each is from 5 to 50% by volume, provided that the total proportion of the electrically conductive carbon black and the aluminum component is from 10 to 60% by volume, and the difference in solubility parameter between the thermoplastic resin of the surface layer and the thermoplastic resin of the shielding layer is 3.0, or less.

One of the features of the invention is that aluminum is used and it can be easily and uniformly mixed with thermoplastic resins because its specific gravity is small compared with other metals. Further, because of its high flexibility, aluminum is less likely to damage a mixer, mold, or other equipment during the mixing and molding processes. In addition, aluminum has good workability. Furthermore, aluminum is not corroded by moisture in air as are iron and other metals.

The electromagnetic wave-shielding material of the invention not only possesses excellent electromagnetic wave-shielding properties, but the following advantages.

(1) Light weight;
(2) Since the composition is thermoplastic; it can be molded into any desired form;
(3) Mechanical characteristics such as bending strength and impact strength are good; and
(4) Fabrication costs normally required for the shielding treatments of electromagnetic waves (e.g., arc spray coating, electrical coating or plating of metals) are not required, which greatly reduces costs.

The sandwich structure including a foamed layer as a shielding layer offers the following advantages:

(5) The mechanical strength is further increased.
(6) The residual stress in a molded article is very small, and therefore, even in the production of large-sized molded articles, there can be obtained molded articles which are decreased in warp and strain—i.e., have a high dimensional accuracy.
(7) The finished surface of the molded article is beautiful and, therefore, it is possible to omit secondary processings.
(8) In order to improve the safety of the molded article, or to ensure safety during assembling and working, the surface of the molded article can be made insulative.
(9) When used in housing for electronic devices, it increases the heat dissipation efficiency in the inside thereof because of its high thermal conductivity.
(10) Since it is provided with electrically conductive properties, it is effective in eliminating difficulties created by static electricity—i.e., it has the effect of shielding static electricity.

Furthermore, the incorporation of a flame retardant into each of the shielding layer and the surface layer provides an electromagnetic wave-shielding material having superior flame retardant properties (V-O as determined by Underwriter's Laboratories (UL) Method No. 94 in ⅛ inch thickness).

Materials provided with flame retardant properties provide a safety with respect to abnormal current in electronic devices.

In that the electromagnetic wave-shielding material of the invention possesses the above-described effects as well as excellent electromagnetic wave-shielding properties, it will have various applications. Typical uses are shown below:

(1) Housing materials for office equipment such as a facsimile, a printer and a word-processor, and housing and structural materials for office computers and large-scale computers;
(2) Housing materials for electronic equipment such as a television set, a video system, a microwave oven, an air-conditioner and a sewing machine, and housing materials for communication equipments, various measuring instruments and medical instruments;
(3) Housing materials for control devices in connection with the engine power of a car, a meter display, a speed controller, a wiper-controlling unit, and a mirror-controlling unit;
(4) Prevention of noise for a car radio, a telephone, a television, and an illumination equipment;
(5) Protective cases for instruments used in cars;
(6) Panel housings for control instruments used in cars;
(7) Covers for electric wires in cars, home electric applicances, and office automation (OA) equipments (e.g., a furnace tube);
(8) Housing materials for control instruments such as NC machine tools and industrial robots.

BRIEF DESCRIPTION OF THE DRAWINGS

In FIGS. 4 to 7, the abscissa is a radiation frequency (HMz), and the ordinate, a radiation field strength (d$\beta\mu$V/m).

Figure 1:
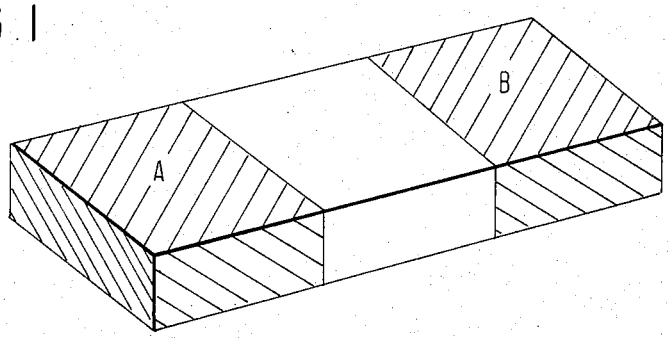
FIG. 1 is a perspective view of a test specimen for use in the measurement of volume resistance, wherein A and B (obverse and reverse surfaces) indicate surfaces on which an electrically conductive silver paint has been coated.

DETAILED DESCRIPTION OF THE INVENTION (A) Thermoplastic Resin

Thermoplastic resins which can be used in the preparation of the shielding layer of the invention are as follows:

(i) Modified polyolefins;
(ii) Copolymers of ethylene and unsaturated carboxylic acids and/or their anhydrides (hereinafter referred to as "ethylene copolymers (I)");

(iii) Copolymers of ethylene and alkyl acrylate and/or alkyl methacrylate (hereinafter referred to as "ethylene copolymers (II)");
(iv) Styrene-based resins;
(v) Vinyl chloride-based resins;
(vi) Polyamide resins; and
(vii) Polycarbonate resins.

While molecular weight of the thermoplastic resins which can be used in the present invention is generally from 10,000 to 1,000,000, preferably from 20,000 to 500,000, crystalline thermoplastic resins have generally a melting point of not higher than 300° C., preferably 60° to 300° C., and non-crystalline thermoplastic resins has generally a softening point of not lower than 20° C., preferably from 20° to 250° C.

These thermoplastic resins will hereinafter be explained in more detail.

(i) Modified Polyolefins

Modified polyolefins as used herein are prepared by modifying polyolefins with unsaturated carboxylic acids or their derivatives.

Polyolefins which can be used include an ethylene homopolymer, a propylene homopolymer, an ethylene-propylene copolymer, a copolymer of ethylene and/or propylene with α-olefin containing at most 7 carbon atoms (the proportion of α-olefin is at most 20% by weight), and a copolymer of ethylene with a vinyl compound such as vinyl acetate, acrylates and methacrylates (the proportion of the vinyl compound is at most 50 mol%, preferably at most 40 mol%). The molecular weight of the polyolefin is usually from 20,000 to 1,000,000, preferably from 20,000 to 500,000, and particularly preferably from 50,000 to 300,000. Ethylene homopolymers having density of 0.900 to 0.980 g/cm$^3$, a propylene homopolymer, an ethylene-propylene copolymer, and copolymers of ethylene or propylene and other α-olefins are preferred.

Typical examples of unsaturated carboxylic acids or derivatives thereof which can be used include monobasic carboxylic acids containing at most 10 carbon atoms and at least one double bond, e.g., acrylic acid and methacrylic acid, dibasic carboxylic acids containing at most 15 carbon atoms and at least one double bond, e.g., maleic acid, and anhydrides of such dibasic carboxylic acids, e.g., maleic anhydride. Of these unsaturated carboxylic acids or derivatives thereof, maleic acid and maleic anhydride are particularly preferred.

The modified polyolefin is generally obtained by treating a polyolefin with an unsaturated carboxylic acid and/or its derivative in the presence of an organic peroxide.

The modified polyolefin of the invention can be prepared by various known techniques, e.g., a solution method, a suspension method and a melting method, as described in British Pat. No. 1,073,567, U.S. Pat. No. 3,491,056 and *Encyclopedia of Polymer Science and Technology*, Vol. 6, p. 453 and Vol. 11, p. 616.

In modifying the polyolefin with the unsaturated carboxylic acid or derivative thereof by the solution method, the polyolefin and the unsaturated carboxylic acid or its derivative are introduced into a non-polar organic solvent. A radical initiator is added and the resulting mixture is heated at a high temperature to obtain the desired modified polyolefin. Non-polar organic solvents which have a boiling point of at least 30° C., particularly 40° C. or more, and a melting point of not more than 40° C., particularly not more than 30° C., are preferably used. Suitable examples of non-polar organic solvents include hexane, heptane, benzene, toluene, xylene, chlorobenzene, and tetrachlorobenzene. With regard to the radical initiator, the decomposition temperature to obtain a half-life period of one minute is preferably from 70° to 230° C. Preferred examples of radical initiators are organic peroxides such as 2,3-dimethyl-2,5-di(tert-butylperoxy)hexane, 2,5-dimethyl-2,5-di(tert-butylperoxy)hexyne-3, and benzoyl peroxide. The treatment temperature is a temperature at which the polyolefin used is dissolved, and it is usually from 110° to 160° C. and preferably from 130° to 150° C.

When the polyolefin is modified with unsaturated carboxylic acid or derivative thereof by the suspension method, the polyolefin and the unsaturated carboxylic acid or derivative thereof are introduced into a polar solvent (generally, water). A radical initiator as described above is then added and the mixture is treated under high pressure at a temperature of at least 100° C.

When the polyolefin is modified with unsaturated carboxylic acid or derivative thereof by the melting method, there is used a melt kneader (e.g., an extruder) which is generally used in the field of synthetic resins, into which the polyolefin, the unsaturated carboxylic acid or derivative thereof, and the radical initiator as described above are introduced. The mixture is then treated while melt-kneading. The kneading temperature is within the temperature range of from the melting point of the polyolefin to 300° C. However, the temperature varies depending on the type of polyolefin and radical initiator. In the case of polyethylene, the kneading temperature is usually from 120° to 270° C., and in the case of polypropylene, it is usually from 160° to 270° C.

In both cases where the modified polyolefin is used (no polyolefin is used) and a mixture of the modified polyolefin and a polyolefin is used, the amount of the unsaturated carboxylic acid and/or its derivative contained therein is from 0.01 to 1.0% by weight, preferably from 0.02 to 1.0% by weight.

(ii) Ethylene Copolymers (I)

Ethylene copolymers (I) as used herein are prepared by copolymerizing ethylene with an α,β-ethylenically unsaturated acid containing from 3 to 12 carbon atoms and/or its anhydride. Typical examples of such unsaturated acids are acrylic acid, methacrylic acid, crotonic acid, maleic acid, itaconic acid, and isocrotonic acid. In particular, acrylic acid and methacrylic acid are preferred. The proportion of the unsaturated acid in the copolymer is from 0.2 to 30% by weight and usually from 0.5 to 28% by weight. The flow rate M.I. of ethylene copolymer (measured according to ASTM D 1238-79 under Condition E) is from 0.1 to 400 g/10 min., with the range of from 1.0 to 400 g/10 min. being particularly preferred. When an ethylene copolymer having M.I. of less than 0.1 g/10 min., the fluidity is poor and further, there cannot be obtained a molded article having suitable flexibility. On the other hand, when an ethylene copolymer having M.I. of more than 400 g/10 min., there cannot be obtained the desired product having good mechanical strength, and further, the heat resistance of the product is poor.

The total proportion of the unsaturated acid and its anhydride in the ethylene copolymer is from 0.2 to 30% by weight, preferably from 0.5 to 28% by weight, and particularly preferably from 0.5 to 16% by weight. When the proportion is less than 0.2% by weight, the resulting composition has poor flexibility although its moldability is satisfactory. On the other hand, when the proportion exceeds 30% by weight, the flexibility of the resulting composition is satisfactory, but its tensile strength, transparency, and heat resistance are poor.

(iii) Ethylene Copolymers (II)

Ethylene copolymers (II) are prepared by copolymerizing ethylene with at least one ester selected from the group consisting of acrylic or methacrylic acid esters of aliphatic monohydric primary alcohols containing at most 6 (i.e., 6 or less) carbon atoms. Examples include methyl, ethyl, n-propyl, n-butyl, n-amyl, and n-hexyl esters of acrylic or methacrylic acid. Of these esters, acrylic acid or methacrylic acid esters of aliphatic monohydric primary alcohols containing 1 to 2 carbon atoms are preferred. In particular, ethyl acrylate and methyl methacrylate are preferred. The proportion of the ester in the copolymer is from 1 to 30% by weight and usually from 2 to 30% by weight. M.I. is from 1.0 to 200 g/10 min., with the range of from 5.0 to 200 g/10 min. being particularly preferred. When an ethylene copolymer having M.I. of less than 1.0 g/10 min., the fluidity is poor, and therefore, there can not be obtained a good product. On the other hand, when an ethylene copolymer having M.I. of more than 200 g/10 min., there cannot be obtained a good product because the mutual solubility between the ethylene copolymer and other thermoplastic resins is poor.

The proportion of the ester in the ethylene copolymer is from 1.0 to 30% by weight, preferably from 2.0 to 30% by weight, and particularly preferably from 5.0 to 28% by weight. When the proportion of the ester is less than 1.0% by weight, the flexibility of the resulting composition is poor although its moldability is satisfactory. On the other hand, when it exceeds 30% by weight, the flexibility of the composition is excellent, but its tensile strength and heat resistance are poor.

Ethylene copolymers (I) and (II) can be prepared by copolymerizing ethylene with the above-described unsaturated carboxylic acid and/or anhydride thereof, or with the above-described ester, by the use as a catalyst of a free radical-releasing agent (e.g., organic peroxides, and azo compounds) at a temperature of from 100° to 400° C., preferably from 120° to 300° C., and a pressure of from 140 to 1500 kg/cm². They are produced on a commercial scale and widely used in various applications. See *Encyclopedia of Polymer Science and Technology*, Vol. 6, p. 388.

(iv) Styrene-Based Resins

Styrene-based resins as used herein are broadly divided as follows:
(1) Styrene homopolymer and copolymers of styrene and other monomers, said styrene constituting a major component (hereinafter referred to as "styrene-based resins (A)").
(2) Impact-resistant resins as prepared by reacting a rubber-like material as described hereinafter with styrene or styrene and other vinyl compounds (hereinafter referred to as "styrene-based resins (B)").
(3) Polymers as prepared by reacting polyphenylene ether with styrene, etc., or a mixture of styrene-based resin (A) and polyphenylene ether (hereinafter referred to as "styrene-based resins (C)").

These styrene-based resins (A), (B) and (C) may be used alone or in combination with each other. The total styrene content of the styrene-based resins is at least 5% by weight.

These styrene-based resins (A), (B) and (C) will hereinafter be explained in detail.

(1) Styrene-Based Resins (A)

Styrene-based resins (A) as used herein include a styrene homopolymer (generally having a molecular weight of from 50,000 to 300,000) and copolymers of styrene and organic compounds having a double bond, having a styrene content of at least 60% by weight. Typical examples of the double bond-containing organic compounds include ethylene, vinyl acetate, maleic anhydride, acrylonitrile, and methyl methacrylate. A method of production of these styrene-based polymers is well known, and they are widely used in a wide variety of applications. See *Encyclopedia of Polymer Science and Technology*, Vol. 13, p. 128.

(2) Styrene-Based Resins (B)

Styrene-based resins (B) as used herein are prepared by graft-polymerizing at least one member (hereinafter referred to as "rubber-like material") selected from the group consisting of butadiene-based rubber, acrylic acid ester-based rubber, ethylene/propylene-based rubber, and chlorinated polyethylene-based rubber, with styrene alone or a mixture of styrene and at least one vinyl compound selected from the group consisting of acrylonitrile and methyl methacrylate.

These rubber-like materials will hereinafter be explained in detail.

(a) Butadiene-Based Rubber

The term "butadiene-based rubber" is used herein to mean those rubbers composed mainly of butadiene—i.e., containing 60% by weight or more of butadiene, including butadiene homopolymer rubber, and butadiene copolymer rubbers comprising butadiene and a small amount of styrene or acrylonitrile (e.g., SBR and NBR). The butadiene/styrene copolymer rubber may be a block copolymer rubber, or a random copolymer rubber. See *Encyclopedia of Polymer Science and Technology*, Vol. 2, p. 104 and p. 678.

(b) Acrylic Acid Ester-Based Rubber

This acrylic acid ester-based rubber is prepared by emulsion-polymerizing acrylic acid ester (e.g., butyl acrylate) and a small amount (usually 10% by weight or less) of different monomer (e.g., acrylonitrile) in the presence of a catalyst, e.g., persulfonic acid salt, and is usually called acryl rubber. See *Encyclopedia of Polymer Science and Technology*, Vol. 1, p. 226.

(c) Ethylene/Propylene-Based Rubber

The term "ethylene/propylene-based rubber" is used herein to mean those multi-copolymerization rubbers including an ethylene/propylene copolymer rubber, and terpolymer rubbers composed mainly of ethylene and propylene and of small amounts (usually 10% by weight or less) of monomers, such as straight or branched diolefins containing two double bonds at the terminals thereof (e.g., 1,4-pentadiene, 1,5-hexadiene, and 3,3-dimethyl-1,5-hexadiene), straight or branched diolefins containing one double bond at the terminal thereof (e.g., 1,4-hexadiene and 6-methyl-1,5-heptadiene), and cyclic dienes or their derivatives (e.g., bicyclo[2,2,1]-heptene-2). The weight ratio of the ethylene monomer unit to the propylene monomer unit in the ethylene/propylene-based rubber is preferably from 30/70 to 70/30. These ethylene/propylene-based rubbers can be prepared by copolymerizing ethylene and propylene, or ethylene, propylene, and the above-described monomers in the presence of a catalyst system comprising a transition metal compound, an organoaluminum compound, and the like. See *Encyclopedia of Polymer Science and Technology*, Vol. 6, p. 359.

(d) Chlorinated Polyethylene-Based Rubber

This chlorinated polyethylene-based rubber is prepared by chlorinating polyethylene powder or grains as described hereinafter in an aqueous suspension, or by chlorinating polyethylene dissolved in an organic solvent. It is preferred to use the chlorinated polyethylene-based rubber as prepared by chlorinating in an aqueous suspension. In general, the rubber is amorphous or crystalline chlorinated polyethylene having a chlorine content of from 20 to 50% by weight, with amorphous chlorinated polyethylene having a chlorine content of from 25 to 45% by weight being particularly preferred. The polyethylene as used herein includes an ethylene homopolymer and copolymers of ethylene and 10% by weight or less of α-olefins (usually containing 6 or less carbon atoms). The density is generally from 0.910 to 0.970 g/cc, and the molecular weight is from 50,000 to 700,000. See *Encyclopedia of Polymer Science and Technology*, Vol. 6, p. 432.

In preparing the styrene-based resins (B) of the invention, the Mooney viscosity of the rubber-like material is desirably from 20 to 140, with the range of from 30 to 120 being particularly suitable, although it varies depending on the type of the rubber-like material. These rubber-like materials are commercially produced and widely used in a wide variety of applications. Their method of production, characteristics, and uses are well known (see, for example, S. Kanbara, *Goseigomu Handbook (Synthetic Rubber Handbook)*, Asakura Shoten, Tokyo (1967)).

Styrene-based resins (B) as used herein are prepared by graft-polymerizing styrene alone or a mixture of styrene and at least one different vinyl compound (i.e., acrylonitrile and methyl methacrylate) onto the above-described rubbers. Graft-polymerization methods which can be used include a bulk polymerization method, a solution polymerization method, an emulsion polymerization method, an aqueous suspension method, and a combination thereof (e.g., a process in which, after bulk polymerization, aqueous suspension polymerization is performed). In general, the amount of the rubber-like material used in the preparation of 100 parts by weight of the styrene-based resin (B) is from 3 to 40 parts by weight and preferably from 5 to 35 parts by weight, with the range of from 5 to 30 parts by weight being particularly suitable. (There may be employed a process in which a relatively large amount of rubber-like material is used to prepare a graft polymer containing a large amount of rubber-like material, and the thus-prepared graft polymer is mixed with the above-described styrene, acrylonitrile, or methyl methacrylate homopolymer or copolymer resin. In this case, the amount of the rubber-like material used is calculated based on that of the resulting mixture including non-grafted rubber-like material.) The molecular weight of the grafted parts consisting of styrene or a mixture of styrene and acrylonitrile and/or methyl methacrylate is usually from 1,000 to 300,000 and preferably from 2,000 to 200,000. In general, all of the monomer used are rarely bound to the rubber-like material, resulting in the formation of homopolymer or copolymer of the monomer. These homopolymers and copolymers are used as such without being separated from the graft copolymer.

Typical examples of the thus-prepared styrene-based resins (B) include:

impact-resistant styrene resin (HIPS resin) as prepared by graft-polymerizing styrene alone onto a butadiene homopolymer or a styrene/butadiene block or random copolymer rubber (SBR) (see *Encyclopedia of polymer Science and Technology*, Vol. 13, p. 193);

acrylonitrile/butadiene/styrene terpolymer resin (ABS resin) as prepared by graft-copolymerizing styrene and acrylonitrile onto a butadiene homopolymer rubber, SBR, or acrylonitrile/butadiene copolymer rubber (NBR) (see *Encyclopedia of Polymer Science and Technology*, Vol. 1, p. 436);

methyl methacrylate/butadiene/styrene terpolymer resin (MBS resin) as prepared by graft-copolymerizing styrene and methyl methacrylate onto butadiene homopolymer rubber or SBR;

acrylonitrile/acrylic acid ester/styrene terpolymer resin (AAS resin) as prepared by graft-copolymerizing acrylonitrile and styrene onto acrylic acid ester-based rubber;

graft copolymer resin (AES resin) as prepared by acrylonitrile and styrene onto ethylene/propylene-based rubber;

graft copolymer resin (ACS resin) as prepared by graft-copolymerizing styrene and acrylonitrile onto chlorinated polyethylene-based rubber; and graft copolymer resin (MCS resin) as prepared by graft-copolymerizing styrene and methyl methacrylate onto chlorinated polyethylene-based rubber.

(3) Styrene-Based Resins (C)

Styrene-based resins (C) as used herein are polymers as prepared by reacting styrene with polyphenylene ether (hereinafter referred to as "PPO") represented by the general formula (I) as described hereinafter, or mixtures of PPO and styrene-based resins (A) as described hereinbefore.

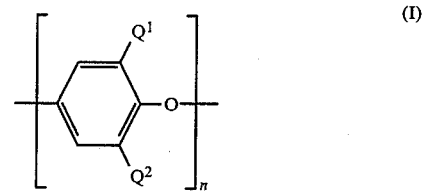

wherein $Q^1$ and $Q^2$ may be the same or different and are each an alkyl group containing from 1 to 4 carbon atoms, and n is a positive integer of at least 50, usually at least 100. See *Encyclopedia of Polymer Science and Technology*, Vol. 10, p. 92.

Typical examples of PPO include poly(2,6-dimethylphenylene-1,4-ether), poly(2,6-diethylphenylene-1,4-ether), poly(2-methyl-6-ethylphenylene-1,4-ether), poly(2-methyl-6-propylphenylene-1,4-ether), poly(2,6-dipropylphenylene-1,4-ether), poly(2-methyl-6-butylphenylene-1,4-ether), and poly(2,6-dibutylphenylene-1,4-ether). Of these compounds, poly(2,6-dimethylphenylene-1,4-ether) is preferably used.

These styrene-based resins (C) can be prepared by graft-copolymerizing styrene alone, or styrene and at least one comonomer selected from the group consisting of styrene containing one or two alkyl groups, acrylonitrile, methyl methacrylate and butyl acrylate onto PPO.

The styrene-based resins (C) can also be prepared by mixing the above-described styrene-based resins (A) and PPO. The proportion of the styrene-based resin (A) in the resulting mixture is from 5 to 80% by weight and preferably from 10 to 70% by weight.

(v) Vinyl Chloride-Based Resins

Vinyl chloride-based resins as used herein are a vinyl chloride homopolymer and copolymers of vinyl chloride and 50% by weight or less (preferably 45% by weight or less) of compounds containing at least one double bond capable of undergoing copolymerization with vinyl chloride. In these vinyl chloride-based resins, the degree of polymerization is usually from 100 to 4,000 and preferably from 200 to 2,500, with the range of from 200 to 1,500 being particularly preferred. Typical examples of such compounds containing at least one double bond as defined above include vinylidene chloride, ethylene, propylene, vinyl acetate, acrylic acid and methacrylic acid and their esters, maleic acid and its esters, and acrylonitrile. These vinyl chloride-based resins can be prepared by homopolymerizing vinyl chloride or copolymerizing vinyl chloride and a vinyl compound as described above in the presence of a free radical catalyst. Their process of production is well known, and they are widely used in a wide variety of applications. See *Encyclopedia of Polymer Science and Technology*, Vol. 14, p. 305.

(vi) Polyamide Resins

Polyamide resins as used herein are generally called nylon, in which the main chain is composed of repeating amido group (—CONH—). These polyamide resins are generally prepared as follows:
(1) Ring opening of lactam
   HN.R$^1$CO→(HNR$^1$CO)
(2) Condensation of amino acid
   H$_2$N.R$^2$.COOH→(HNR$^2$CO)+H$_2$O
(3) Condensation of diamine and dicarboxylic acid
   H$_2$N.R$^3$.NH$_2$+HOOC.R$^4$COOH→(NHR$^3$NHCOR$^4$CO)+H$_2$O In the above formulae, R$^1$ is an alkylene group containing from 5 to 11 carbon atoms, R$^2$ is an alkylene group containing from 5 to 16 carbon atoms, R$^3$ is an alkylene group containing from 2 to 11 carbon atoms, and R$^4$ is an alkylene group containing from 3 to 40 carbon atoms.

Typical examples of the polyamide resins include:
nylon 6 as prepared by ring opening polymerization of ε-caprolactam;
similar polyamide resins as preparee by ring opening polymerization of γ-butyrolactom δ-valerolactam, ξ-enantholactam, or η-capryllactam;
nylon 12 as prepared by ring opening polymerization of ω-laurolactam;
nylon 11 as prepared by heat-condensation of 11-aminoundecanoic acid;
nylon 66 as prepared by polycondensation of hexamethylenediamine and adipic acid; and
nylon 6,10 as prepared by polycondensation of hexamethylenediamine and sebacid acid. In addition, N-alkoxymethyl-modified nylon (type 8 nylon), transparent nylon trimethylhexamethylenediamine/terephthalic acid condensates, nylon 9, nylon 13, Q2 nylon, and the like can be used.

For these polyamide resins, the molecular weight is usually at least 10,000, preferably from 15,000 to 50,000, and more preferably from 15,000 to 30,000. In connection with the degree of polymerization, it is at least 100, preferably from 150 to 500, and more preferably from 150 to 300.

These polyamide resins are commercially produced and widely used in a wide variety of applications. Their process of production, characteristics, and so forth are described in detail, for example, in O. Fukumoto ed., *Plastic Zairyo Koza (Plastic Materials)*, No. 16 "Polyamide Resins", Nikkan Kogyo Shinbun Sha, Tokyo (1970) and *Encyclopedia of Polymer Science and Technology*, Vol. 20, p. 483. Of these polyamide resins, polyamide resins having a viscosity (at 260° C.) of from 500 to 50,000 poises are preferred, with those having a viscosity (at 260° C.) of from 500 to 3,000 poises being particularly preferred.

(vii) Polycarbonate Resins

Polycarbonate resins as used herein can usually be prepared by the following four methods:
(1) Ester exchange reaction between carbonic acid diesters derived from monofunctional aromatic or aliphatic hydroxy compounds and hydroxy compounds (hereinafter referred to as "Method (1)");
(2) Ester exchange reaction of dihydroxy compounds themselves, or between dihydroxy compounds and bisalkyl or bisaryl carbonate or other dihydroxy compounds (hereinafter referred to as "Method (2)");
(3) Reaction of dihydroxy compounds and phosgene in the presence of an acid coupling agent (hereinafter referred to as "Method (3)"); and
(4) Reaction of dihydroxy compounds and bischlorocarbonic acid esters of dihydroxy compounds in the presence of an acid coupling agent (hereinafter referred to as "Method (4)").

Of the above-described methods, Methods (1) and (3) are industrially employed.

Method (1) is called a melting method, in which bisphenol A and diphenyl carbonate are reacted at elevated temperatures and under reduced pressure in an inert gas atmosphere in the absence of presence of an ester exchange catalyst. Ester exchange catalysts which can be used include various metals, metal alcoholates, oxides, carbonic acid salts, acetic acid salts, hydrides, organic acid alkali salts, and alkaline earth metal amides.

Method (3) is called a solvent method, in which bisphenol A and phosgene are reacted at room temperature in a solvent in the presence of an acid coupling agent (e.g., caustic alkali and pyridine).

The molecular weight of the polycarbonate resin as produced by Method (1) is usually from 5,000 to 50,000 and more usually from 10,000 to 30,000. The molecular weight of the polycarbonate resin as produced by Method (3) is usually from 10,000 to 200,000 and more usually from 20,000 to 150,000.

These polycarbonate resins are commercially produced and widely used in various applications. Their process of production, characteristics, and so forth are described in detail, for example, in Tachikawa and Sakajiri ed., *Plastic Zairyo Koza (Plastic Materials)*, No. 17, "Polycarbonates", Nikkan Kogyo Shinbun Sha, Tokyo (1971) and *Encyclopedia of Polymer Science and Technology*, Vol. 10, p. 710.

These thermoplastic resins (i) to (vii) may be used alone or in combination with the above-described rubber-like material. When the thermoplastic resins are used in combination with the rubber-like material, the proportion of the rubber-like material in the thermoplastic resin/rubber-like material mixture is 30% by weight or less and preferably 25% by weight or less. The thermoplastic resins and the thermoplastic resin/rubber-like material mixture are hereinafter referred to merely as "thermoplastic resin component".

(B) Aluminum Component

The mean size of the powdery aluminum or aluminum alloy is generally from 250 to 20 mesh. The diameter of the fibrous aluminum or aluminum alloy is generally from 0.0020 to 0.50 mm, and a fibrous aluminum or aluminum alloy having a length of 10 mm or less is preferred since it is easy to work with. Flaky aluminum or aluminum alloy may be in a form such as circular, triangular, square, rectangular, hexagonal or like form having a surface area of from 0.1×0.1 mm to 5×5 mm. A flaky aluminum or aluminum alloy having a thickness of 0.1 mm or less is particularly preferred. In particular, a flaky aluminum or aluminum alloy having a square form with a surface area of about 1×1 mm, and a thickness of about 0.03 mm has good dispersibility in the thermoplastic resins and does not become entangled unlike aluminum fibers, not forming any entangled material. Furthermore, these aluminum flakes have a strong tendency of orientating in the direction in which the impact resistant resin flows during molding. When used in the same amount, therefore, the composition containing aluminum flakes not only has good electric conductivity, but also is improved with respect to flexural modulus of elasticity compared with the composition containing aluminum fibers. In particular, aluminum flakes having a surface area of 1 mm×1 mm is most preferred from a viewpoint of dispersion properties.

The powdery, fibrous and flaky aluminum or aluminum alloys may be used alone. However, it is suitable to use them in combination with each other because the effect of the invention can be obtained at a low mixing ratio. The aluminum content of the aluminum alloy is usually at least 80% by weight.

(C) Carbon Black

The electrically conductive carbon black as used herein generally has a specific surface area of from 20 to 1,800 m²g, as determined by the low temperature nitrogen absorption method (see ASTM D 3037-78) and the BET method, and a pore volume of from 1.5 to 4.0 ml/g as determined by the mercuryl pressure-introduction method (see *Powder Technology*, Vol. 29 (1), pp. 45–52, 1981) within the pore diameter of from 30 to 7,500 Å. In particular, carbon black having a specific surface area of from 200 to 1,200 m²/g can be effectively used in the invention.

The carbon black includes channel black, acetylene black, and carbon black produced by the furnace black method. Of these, carbon black produced by the furnace black method is particularly preferred because it has good dispersibility and does not reduce mechanical strength of the resulting composition. The method of production, physical properties, etc., of such carbon blacks are well known as described in Carbon Black Association ed., *Handbook of Carbon Black*, Tosho Shuppan, Tokyo (1972), *Handbook of Rubber/Plastic Compounding Chemicals*, Rubber Digest Co., Ltd., Japan (1974), and *Encyclopedia of Polymer Science and Technology*, Vol. 2, pp. 820–836.

In the electromagnetic wave-shielding material of the invention, it is necessary for the surface layer to cause almost no reflection of electromagnetic waves. The surface layer is further required to have characteristics such as a strength. For this reason, synthetic resins are used which have insulative characteristics and can be easily molded by molding techniques such as injection molding, vacuum molding, extrusion molding, press molding, and stamping molding. Thus the above-described thermoplastic resin component used in the shielding layer can be used. Polyolefins used for the preparation of the modified polyolefins can be also used as the thermoplastic resin component of the surface layer.

The difference in solubility parameter between the thermoplastic resin as used in the surface layer and the thermoplastic resin as used in the shielding layer is 3.0 or less, preferably 2.7 or less, and more preferably 2.5 or less. The solubility parameter is described in P. A. J. Small, *Journal of Applied Chemistry*, Vol. 3, p. 71 (1953). The solubility parameter (hereinafter referred to merely as "S.P.") can be calculated by the formula:

$$S.P. = \sqrt{\Delta E/V}$$

wherein $\Delta E$ is the difference between evaporation energy, $E_1$ (cal/mol), of solvent and evaporation energy, $E_2$ (cal/mol), of solute, and V is the total volume (cc/mol) of mixed solution. This ratio, $\Delta E/V$, is called a cohesive energy density. The S.P. value is used as a measure of dissolution, and is usually determined as follows:

(1) Calculated from the physical value having quantitative relation with the S.P. value.
(2) Calculated from the mutual solubility with a substance having an already known S.P. value.

The S.P. values of various polymeric substances are shown below:

| Polymeric Substance | S.P. (cal/cm²)½ |
|---|---|
| Polyethylene (homopolymer) | 7.9 |
| Polypropylene (homopolymer) | 8.1 |
| Polystyrene (homopolymer) | 9.1 |
| Polyvinyl chloride (homopolymer) | 9.5–9.7 |
| Polycarbonate | 9.8 |
| Polyamide | 12.7–13.6 |
| Polyacrylonitrile (homopolymer) | 15.4 |
| Polybutadiene (homopolymer) | 8.4 |
| Polymethyl methacrylate (homopolymer) | 9.25 |
| Polyphenylene oxide (PPO) | 10.2 |
| Polybutylene terephthalate (PBT) | 10.8 |
| Polyethylene terephthalate (PET) | 10.7 |
| Modified polyolefin | 9.2–13.0 |
| Styrene-based resins (A) | 9.1–15.4 |
| Styrene-based resins (B) | 9.1–15.4 |
| Styrene-based resins (C) | 9.1–10.2 |
| SBR | 8.1–8.5 |
| NBR | 9.4–9.5 |

The solubility parameters of modified products (graft-copolymerized products) are complex to determine since, when dicarboxylic acid, for example, is dimerized, the functional group is closed, resulting in changes in its solubility. In the case of non-association, S.P.=13.0, whereas when dimerization proceeds by association due to a hydrogen bond, S.P.=9.2 It is, therefore, believed that the S.P. values of the modified products are within the range of from 9.2 to 13.0.

In general, it is preferred to use in the surface layer the same group of thermoplastic resin component as that used in the shielding layer, e.g., when a modified polyolefin is used in the shielding layer, a modified polyolefin is preferably used in the surface layer. In addition, the following combinations of thermoplastic resin components are preferably used in the shielding layer and the surface layer, respectively.

| Shielding Layer | Surface Layer |
| --- | --- |
| Modified Polyolefins | Polyolefins, Styrene-based Resins (A)-(C), Polyamide Resins and/or Polycarbonate Resins |
| Styrene-based Resins (A)-(C) | Styrene-based Resins (A)-(C) |
| Ethylene Copolymers (I) and (II) | Polyolefins, Modified Polyolefins, Styrene-based Resins (A)-(C), Polyamide Resins and/or Polycarbonate Resins |

While the difference in S.P. between a modified polyolefin and its original polyolefin (i.e., non-modified polyolefin) may be outside the preferred range described above, such combination is still preferred.

The function of the shielding layer is to absorb electromagnetic waves passing through the surface layer, converting their energy into heat and absorbing them as heat, or alternatively, allowing them to escape as excited electricity to another place.

For this reason, the amount of the thermoplastic resin component containing in the shielding layer is from 90 to 40% by volume and preferably from 85 to 50% by volume. The amount of the aluminum component contained in the shielding layer is from 5 to 50% by volume and preferably from 10 to 45% by volume. The amount of the electrically conductive carbon black contained is from 5 to 50% by volume and preferably from 10 to 45% by volume.

When the amount of the electrically conductive carbon black contained is less than 5% by volume, no sufficient electrical conductivity necessary for electromagnetic wave-shielding can be obtained. On the other hand, when the electrically conductive carbon black is added in greater amounts than 50% by volume, it becomes difficult to uniformly mix the carbon black with the thermoplastic resin component, and the resulting resinous layer does not have a strength durable for practical use.

Incorporation of aluminum component into the shielding layer is not only performed for the purpose of increasing the electromagnetic wave-shielding performance, but also is intended to achieve multiple scattering of electromagnetic waves on the surface of aluminum component.

In order to enhance the synergistic effect of the electrically conductive carbon black and aluminum component, it is necessary to add the aluminum component in an amount of at least 5% by volume. When the amount of the aluminum component added is less than 5% by volume, the synergistic effect of the carbon black and aluminum component is decreased. On the other hand, when it is more than 50% by volume, it becomes impossible to uniformly mix the aluminum component with the thermoplastic resin component.

One of the features of the invention is that in the shielding layer aluminum component is used in combination with electrically conductive carbon black, and the total amount of the aluminum component and electrically conductive carbon black is from 10 to 60% by volume. Particularly it is preferred for the total amount to be within the range of from 10 to 50% by volume. In connection with the volume ratio of aluminum component to electrically conductive carbon black, it is preferably within the range of from 4.0/1 to 1/4.0. It has been found that by mixing electrically conductive carbon black having the electromagnetic wave-shielding effect at a high frequency region (MHz) and aluminum component having the electromagnetic wave-shielding effect at a low frequency region (KHz), the resulting mixture is allowed to have the electromagnetic wave-shielding effect over a wider frequency region, and that even at a region where the electromagnetic wave-shielding effect is almost not exhibited when the aluminum component or electrically conductive carbon black is used alone, if they are used in combination with each other, the electromagnetic wave-shielding effect can be exhibited very significantly. Although the exact reason for such significant effect is not known, it is considered that electromagnetic wave energy reflected by or absorbed in the aluminum component is grounded through the electrically conductive carbon black. This is supported by the fact that when the aluminum component is used in combination with the electrically conductive carbon black, the electric conductivity of the shielding layer of the invention is greatly increased.

When the amount of aluminum component and electrically conductive carbon black contained in the shielding layer is less than 10% by volume, its electromagnetic wave-shielding effect is poor particularly at a low frequency region. On the other hand, when the amount is more than 60% by volume, the moldability of the resulting composition is undesirably decreased.

In the production of the electromagnetic wave-shielding material of the invention which is, as described hereinafter, to be used for large-sized molded articles, the suitable molding method for the production of the shielding layer is an expansion injection molding method in which the thermoplastic resin component is compounded with aluminum component, electrically conductive carbon black, and further, with a blowing agent, or a mixture of a blowing agent and a blowing promoters, and the resulting composition is subjected to expansion injection molding. In the case of sandwich injection molding, the shielding layer is sandwiched in the inside of the material.

One of the blowing agents for use in the production of the shielding layer of the invention is a compound which does not decompose during the production of the mixture, but decomposes at lower temperatures than that at which thermal decomposition of the thermoplastic resin components used occurs. Its decomposition temperature is usually from 180° to 350° C. and preferably from 200° to 350° C. These blowing agents are generally used as blowing agents for thermoplastic resin component, and can be broadly divided into two groups, inorganic and organic blowing agents. Typical examples of inorganic blowing agents include carbonic acid salts of the metals of the Groups IA, IB, IIA, IIB, VIB, and VIII, such as sodium hydrogencarbonate, copper carbonate, magnesium potassium carbonate, magnesium carbonate, carbonic acid salt (II), iron carbonate, and magnesium hydrocarbonate, and ammonia and inorganic ammonium salts, such as ammonium phosphate, ammonium hydrogencarbonate, ammonium carbonate, ammonium polyphosphate, ammonium borate, and a mixture of sodium nitrite and ammonium chloride. Typical examples of organic blowing agents include nitroso compounds, such as N,N'-dinitrosopentamethylenetetramine and N,N'-dimethyl-N,N'-dinitrosoterephthalamide, azo compounds, such as azodicarbonamide, azobisisobutylonitrile, azocyclohexylnitrile, diazoaminobenzene, and barium azodicarboxy, sulfonylhydrazide compounds, such as benzenesulfoterehydrazide and its derivatives, diphenylsulfon-3,3-disulfonylhydrazide, and p,p'-oxybis(benzenesulfonylhydrazide), and p-toluenesulfonylazide and 4,4-diphenyldisulfonylazide.

Blowing promoters (co-agents) are desirable to use, since they can not only lower the degree of decomposition of the above-described blowing agents, but also change the speed of decomposition thereof, thereby broadening molding conditions. These blowing promoters are determined depending on the type of the blowing agent used and cannot be determined unconditionally. Typical examples of such blowing promoters include tri-basic lead sulfate, zinc stearate, salicylic acid, phthalic acid, boric acid, a urea resin, and the like. Suitable blowing promoters for use in combination with the blowing agent used are well known.

The amount of the blowing agent used is from 0.01 to 20.0 parts by weight, preferably from 0.02 to 10.0 parts by weight, per 100 parts by weight of the thermoplastic resin component. When the blowing promoter is used, the amount of the blowing promoter contained in the foamed or expanded layer is 10% by weight or less.

Other blowing agents which can be used are hydrocarbons which are inactive to thermoplastic resins component, used at room temperature, and which do not dissolve them, and further, which can be used to impregnate the thermoplastic resin component. In general, straight or branched aliphatic hydrocarbons containing from 3 to 9 carbon atoms are used. Typical examples of such blowing agents are propane, butane, heptane, hexane, and octane. In particular, those straight or branched aliphatic hydrocarbons containing from 4 to 8 carbon atoms are preferred.

In expansion molding of the shielding layer, the expansion ratio is 3 or less, preferably 2.5 or less, and more preferably 2 or less.

In producing the electromagnetic wave-shielding material of the invention, stabilizers against oxygen, heat and light, metal deterioration-preventing agents, fillers, lubricants, and other additives, which are generally used in the field of thermoplastic resins, can be further added. When halogen-containing polymers, such as vinyl chloride-based resins and chlorinated polyethylene, are used, dehydrochlorination agents can be further added. Also, when vinyl chloride-based resins and polyamide resins are used, plasticizers can be added which are generally used in the respective resins.

In view of strict regulations for flame retardant properties, it is preferred to further incorporate halogen-containing organic compounds and antimony oxide as described hereinafter into the surface layer. Into the shielding layer, it is preferred to further incorporate hydrous inorganic substances as well as the halogen-containing organic compounds and antimony oxide.

Halogen-containing organic compounds which are used in the invention are widely known as flame retardants. Of these flame retarders, those having a halogen content of from 20 to 90% by weight, preferably from 30 to 90% by weight, more preferably from 40 to 85% by weight are preferred. In particular, those having a melting point of 200° C. or less and a boiling point of at least 300° C. are suitable. The halogen-containing organic compounds are liquid or solid at room temperature (20° C.), and particularly those having a decomposition initiating temperature or a boiling point of at least 200° C. are preferred. The molecular weight of halogen-containing organic compounds are generally from 500 to 5,000 and preferably from 500 to 4,000. Preferred examples of such halogen-containing organic compounds are chlorine-containing compounds and bromine-containing compounds. Typical preferred examples are tetrachlorophthalic anhydride, chlorinated paraffin, chlorinated bisphenol A, brominated bisphenol S, chlorinated diphenyl, brominated diphenyl, chlorinated naphthalene, tris($\beta$-chloroethyl)phosphate and tris(dibromobutyl)phosphate.

The antimony oxide as used herein is generally used as a flame-retardant aid for the above-described halogen-containing organic compound. Preferred examples are antimony trioxide and antimony pentaoxide.

These halogen-containing organic compounds and antimony oxide are well known as described in the above described *Handbook of Rubber/plastic Compounding Chemicals* and *Encyclopedia of Polymer Science and Technology*, Vol. 7, p. 1.

The hydrous inorganic substance as used herein has a bound water content of from 10 to 80% by weight and a true specific gravity of from 1.0 to 5.0. Hydrous inorganic substances capable of releasing water at 150° to 500° C., particularly 200° to 450° C., are preferably used for the purpose of the invention. Typical examples of such hydrous inorganic substances are hydrates of Group IIA, IIB and IIIB metals and salts containing such metals. Examples include compounds containing water in the molecule thereof, e.g., magnesium hydroxide, calcium hydroxide, aluminum hydroxide ($Al_2O_3 \cdot nH_2O$), hydrous gypsum, kaolin clay, calcium carbonate, hydrotalcite, basic magnesium carbonate, magnesium borate, and precipitating sulfate of barium, magnesium or calcium. These hydrous inorganic substances are insoluble in water, and the solubility in 100 ml of water at 20° C. is generally 10 g or less, preferably 1 g or less, and especially preferably 0.1 g or less. Preferred hydrous inorganic substances include aluminum hydroxide, hydrous gypsum, magnesium hydroxide, calcium carbonate, basic magnesium carbonate, and precipitating magnesium or calcium sulfate. See *Encyclopedia of Polymer Science and Technology*, Vol. 7, p. 740.

The antimony oxides and hydrous inorganic substances which can be used in the present invention have generally an average particle size of 0.1 to 100 $\mu m$, preferably 0.2 to 50 $\mu m$, more preferably 0.3 to 40 $\mu m$.

The amount of each of the halogen-containing organic compound and the antimony oxide being added is at least 5 parts by weight per 100 parts by weight of the total weight of the thermoplastic resin component. The total weight of the halogen-containing organic compound and the antimony oxide is preferably from 10 to 45 parts by weight and more preferably from 15 to 45 parts by weight. The amount of antimony oxide per the halogen element contained in 100 parts by weight of the halogen-containing organic compound is usually from 100 to 600 parts by weight and preferably from 100 to 400 parts by weight. In view of flame retardant properties and bleeding, it is suitably from 150 to 400 parts by weight.

In addition to the processings to make a product flame-resistant by the use of the flame retardants (halogen-containing organic compounds and antimony oxide), hydrous inorganic substances can be added in order to improve moldability and to provide high flame resistance (V-O as determined by the UL-94 method). The amount of the hydrous substance added is 50 parts by weight or less, preferably 45 parts by weight or less, per 100 parts by weight of the total weight of the thermoplastic resin component. The addition of the hydrated inorganic substance in an amount of at least 5 parts by weight, preferably at least 10 parts by weight, and more preferably at least 20 parts by weight, per 100 parts by weight of the electrically conductive carbon black is preferred because it permits the production of a composition having good flame resistance, mechanical characteristics, and moldability.

Where polyamide resins are used as the thermoplastic resin component, rubbers having compatibility with the polyamide resins may be further added in order to increase the impact resistance of the resulting electromagnetic wave-shielding material. Typical examples of such rubbers include butyl rubber, chloroprene rubber, nitrile rubber, styrene/butadiene rubber, ethylene/propylene-based rubber, and their modification products. The amount of the rubber added is 30% by weight or less and preferably 20% by weight or less.

In the preparation of each layer of the electromagnetic wave-shielding material of the invention, all ingredients may be mixed at the same time, or some of the ingredients may be previously mixed to form a mixture, which is in turn mixed with the remaining ingredients (for example, a thermoplastic resin component is previously mixed with electrically conductive carbon black, and the resulting mixture is then mixed with aluminum component). Furthermore, there may be employed a process in which part of the thermoplastic resin component is previously mixed with all or part of the aluminum component and/or electrically conductive carbon black to form a master batch, and the thus-formed master batch is then mixed with the remaining ingredients.

In the preparation of the shielding layer, the necessary ingredients may be dry-blended by the use of a mixer, e.g., a Henschel mixer, which is generally used in processing of thermoplastic resins, or may be molten-kneaded by the use of a mixer, e.g., a Banbury mixer, a kneader, a roll mill, and a screw type extruder. By dry-blending the ingredients and then, molten-kneading the resulting composition (or mixture), a uniform composition can be obtained. In this case, in general, the composition (or mixture) thus molten-kneaded is pelletized and supplied to the subsequent molding process.

Both the molten-kneading and molding should be performed at temperatures higher than the softening point of the thermoplastic resin component used. Since, however, thermal degradation of part of the thermoplastic resin component may occur if the molten-kneading and molding are performed at much higher temperatures, they should be, of course, performed at temperatures lower than that at which the thermal degradation occurs. In molten-kneading and molding, therefore, processing temperature of the thermoplastic resin component varies depending upon the kind of thermoplastic resin used. Typical processing temperatures of the thermoplastic resins are shown below.

| Thermoplastic Resin | Processing Temperature (°C.) | (Preferred Temperature) |
|---|---|---|
| Modified Polyolefins | 200–280 | (200–260) |
| Polyolefins (e.g., polyethylene, polypropylene) | 200–280 | (200–260) |
| Ethylene Copolymers (I) and (II) | 160–280 | (160–260) |
| Styrene-based Resins (A) | 180–250 | (200–250) |
| Styrene-based Resins (B) | 180–250 | (200–250) |
| Styrene-based Resins (C) | 180–300 | (200–300) |
| Vinyl Chloride-based Resins | 230 or less | (150–230) |
| Polyamide Resins | 370 or less | (250–350) |
| Polycarbonate Resins | 370 or less | (250–350) |

In the preparation of the surface and shielding layers, any molding methods can be employed which are generally used in processing of thermoplastic resins. The surface and shielding layers can be produced separately by extrusion molding, injection molding, and press molding.

The electromagnetic wave-shielding material (laminated product) of the invention can be produced by, for example, a process in which the surface and shielding layers previously produced are placed on each other and then, combined together by a press molding method, a stamping method, or by passing them through heated rolls.

The temperature at which the lamination of the surface and shielding layers is performed is sufficient if it is near the melting point of the thermoplastic resin component. Although it is not necessary to use an adhesive for the lamination because the thermoplastic resin component is used in both the surface and shielding layer, if it is deisred to further increase the adhesive strength, an adhesive or a adhesive film may be used between the surface and shielding layers.

The surface and shielding layers can be produced at the same time as a laminated product by a co-extrusion molding method, for example. In addition, a two layer-injection molding machine can be used in the production of such laminated products.

The thus-produced laminated product can be used as such as an electromagnetic wave-shielding material, but can be shaped in any desired form by techniques generally used, such as a stamping method, a press molding method, and a vacuum molding method.

For the production of the electromagnetic wave-shielding material of the invention it is also possible to use multi-layer injection molding method and a sandwich injection molding method. Housing for electronic devices, such as home electric appliances, communication devices, and office automation (OA) devices, have a wide variety of shapes. Of these housings, relatively large-sized ones can be produced by the above-described multi-layer injection molding method and sandwich injection molding method. For the production of large-sized housings, however, the multi-layer injection molding method and sandwich injection molding method cannot often be used in view of strength, stiffness, and dimensional stability.

As a matter of course, the electromagnetic wave-shielding characteristics of the electromagnetic wave-shielding material of the invention are not adversely affected even when the shielding layer is provided as an expanded or cellular layer. The reason for this is that the electromagnetic wave-shielding characteristics are determined by the aluminum component and the electrically conductive carbon black content.

The thus-prepared electromagnetic wave-shielding material of the invention can be shaped into various forms because of its excellent workability and can be used in various applications.

Although the electromagnetic wave-shielding material of the invention is, as described above, composed of two layers, if desired, a multi-layer construction may be employed as long as it does not reduce the effects of the invention and it can be molded.

The present invention will hereinafter be explained in detail by reference to the examples and comparative examples as described hereinafter.

In the examples and comparative examples, the flow rate was measured according to ASTM D 1238-79 under the following conditions: Condition E (hereinafter referred to as "M.I.") for high density polyethylene, modified polyethylene, and an ethylene-ethyl acrylate copolymer; Condition L (hereinafter referred to as "MFI") for polypropylene, a propylene-ethylene block copolymer, and modified polypropylene; Condition N for styrene-based resins; and Condition O for polycarbonate resins.

The volume resistance was measured as follows:

An electrically conductive silver paint was coated on both the obverse and reverse surfaces of each of parts A and B (both having a width of 1 cm) of a molded article (having a length of 3 cm and a width of 1 cm) as shown in FIG. 1. After the paint was fully dried, the resistance between the paint-coated spots for each of parts A and B was measured by the use of a tester (SANWA SR-3TR, manufactured by Sanwa Denki Keiki Co., Ltd.). The thus-measured value was divided by the thickness, t, to obtain the volume resistance. This volume resistance is indicated in the unit of $\Omega \cdot cm$.

Figure 2:
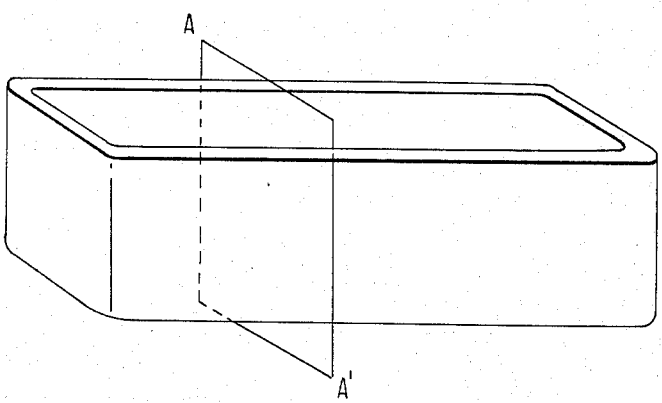
FIG. 2 is a perspective view of a box-like injection molded product (laminated product: electromagnetic wave-shielding material) produced in each example or comparative example.

The effect of shielding electromagnetic waves was measured as follows:

A box as shown in FIG. 2 was produced, in which was placed a portable oscillator adjusted in frequency to 600 MHz. This box was placed in an electric wave shielded place, and the electric waves from the oscillator were received by means of a receiving antenna and measured by means of a wattmeter for microwaves. Similarly, the electric waves from the oscillator, not placed in the box, were measured as a control. The ratio of the former field strength ($\mu V$) to the latter (control) field strength ($\mu V$) was expressed in decibel (dB), and indicated as an electromagnetic wave attenuation amount of the sample sheet.

The thermoplastic resin, rubber-like material, aluminum flake, aluminum powder, aluminum fiber, electrically conductive carbon black, halogen-containing organic compound, antimony oxide, and hydrous inorganic substance as used in the examples and comparative examples are as follows:

High Density Polyethylene

High density polyethylene having M.I. of 10 g/10 min. and a density of 0.955 g/cm$^3$ (hereinafter referred to as "HDPE") was used.

Polypropylene

Polypropylene having MFI of 12.0 g/10 min. and a density of 0.900 g/cm$^3$ (homopolymer; hereinafter referred to as "PP") was used.

Propylene-Ethylene Block Copolymer

A propylene-ethylene block copolymer having MFI of g/10 min. and an ethylene content of 15% by weight (hereinafter referred to as "HIPP") was used.

Modified Polyethylene

A mixture of 100 parts by weight of high density polyethylene (density: 0.960 g/cm$^3$; M.I.: 8.1 g/10 min.), 0.01 part by weight of 2,5-dimethyl-2,5-di(butylperoxy)hexane as an organic peroxide, and maleic anhydride was previously dry-blended for 5 minutes by the use of a Henschel mixer. The thus-blended mixture was molten kneaded in an extruder (diameter: 40 mm; resin temperature: 200° C.) to prepare the desired modified high density polyethylene (hereinafter referred to as "modified PE"). The maleic anhydride content of the modified PE was 0.6% by weight.

Modified Polypropylene

Modified polypropylene (hereinafter referred to as "modified PP") was prepared in the same manner as in the production of the above-described modified PE except that polypropylene (MFI: 2.0 g/10 min.; density: 0.900 g/cm$^3$) was used in place of the high density polyethylene. The maleic anhydride content of the modified PP was 0.6% by weight.

Ethylene-Ethyl Acrylate Copolymer

An ethylene-ethyl acrylate copolymer (M.I.: 250 g/10 min.; density: 0.939 g/cm$^3$; ethyl acrylate content: 25% by weight) (hereinafter referred to as "EEA") was used.

Styrene-Based Resin (PS)

Styrene was suspended in water and, after addition of an emulsifier and a catalyst, polymerized at a temperature of 90° C. to prepare a styrene resin having a melt flow index of 1.30 g/10 min. This styrene resin is designated as "PS".

Styrene-Based Resin (HIPS)

Styrene (92 parts by weight) was graft-copolymerized onto 8.1 parts by weight of a styrene-butadiene random copolymer rubber (styrene content: 25.3% by weight; Mooney viscosity ($ML_{1+4}$): 25) to prepare a high impact polystyrene having a melt flow index of 13.0 g/10 min. This high impact polystyrene is designated as "HIPS".

ABS Resin

A 20-liter autoclave made of stainless steel was charged with 280.0 g (as solids) of a styrene-butadiene copolymer rubber (butadiene content: 80% by weight; gel content of rubber: 80%), 2.0 g of ammonium persulfate, 80.0 g of sodium rosinate for disproportionation, 21.0 g of laurylmercaptan, and 8.0 l (liters) of water. They were uniformly mixed, and 2,520 g of styrene and 1,200 g of acrylonitrile were added thereto. The resulting mixture was stirred, and then, raised in temperature to 70° C. while stirring. At this temperature, polymerization was performed with stirring for 10 hours. To the thus-prepared polymer (grafted product)-containing latex-like material was added a 5% aqueous solution of aluminum sulfate to coagulate the grafted product. The coagulated product was washed with about 5,200 ml of an about 1% aqueous solution of sodium hydroxide, and further, with a large amount (about 30 liters) of hot water maintained at 70° C. The grafted product was dried at about 80° C. under reduced pressure one day and night. There was thus obtained 3,785 g of white powdery grafted product. The Izod impact resistance of the grafted product was 7.5 Kg-cm/cm-notch, and its tensile strength was 468 kg/cm$^2$. The Vicat softening point of the polymer was 101.5° C. The rubber-like material content of the grafted product was 7.3% by weight. This grafted product is hereinafter referred to as "ABS".

MBS Resin

A 20-liter autoclave made of stainless steel was charged with about 12,000 ml of an aqueous dispersion containing 1,380 g of a butadiene-styrene copolymer rubber (Mooney viscosity: 50) consisting of 76.5% by weight of butadiene and 23.5% by weight of styrene. An aqueous solution of 480 g of sodium formaldehydesulfoxylate dihydrate dissolved in about 2,400 ml of water, and 160.0 g of cumene hydroperoxide were added in a stream of nitrogen while maintaining the temperature at 60° C. The mixture was stirred for 1 hour. Then, a mixture of 7,680 g of methyl methacrylate and 32.0 g of cumene hydroperoxide was added, and polymerization was allowed to proceed. After about 7 hours, the polymerization conversion ratio was 91.8%. Thereafter, a mixture of 6,880 g of styrene and 32.0 g of cumene hydroperoxide was added, and polymerization was allowed to proceed. After about 6 hours, the polymerization conversion ratio was 93.3%. To the resulting reaction solution were added an aqueous solution of hydrochloric acid and sodium chloride (salt) to coagulate it. The thus-obtained precipitate was filtered off, thoroughly washed with hot water, and then, dried at a temperature of about 80° C. under reduced pressure for about 24 hours. There was thus obtained a white powdery polymer (grafted product). The Izod impact strength of the grafted product was 7.6 kg.cm/cm-notch, and its tensile strength was 415 kg/cm$^2$. The Vicat softening point of the grafted product was 97.2° C. The rubber-like material content of the grafted product (hereinafter referred to as "MBS") was 9.6% by weight.

AAS Resin

A 20-liter autoclave made of stainless steel was charged with about 8,000 ml of distilled water, 24.0 g of sodium dodecylbenzene sulfonate, 0.80 g of ammonium persulfate as a polymerization catalyst, and as monomers, 784 g of butyl acrylate and 16.0 g of glycidyl methacrylate. Polymerization was performed at 77° C. with stirring until the monomers are almost completely polymerized to prepare acrylic acid ester-based rubber. To the polymerization system containing the acrylic acid ester-based rubber were added 1,680 g of styrene and 720 g of acrylonitrile as monomers, and 16.0 g of potassium persulfate as a polymerization catalyst, and polymerization was performed at 83° C. for 10 hours while stirring. There was thus obtained an emulsion polymer (grafted product) containing almost no unreacted monomers. When a 5% aqueous solution of aluminum sulfate was added dropwise to the above-obtained grafted product-containing emulsion while stirring, the polymer (grafted product) precipitated. This water-containing polymer was then centrifugated to remove the water, and the polymer was fully washed with water and dried at about 50° C. under reduced pressure. The Izod impact strength of the grafted product was 24.8 kg.cm/cm-notch, and its tensile strength was 350 kg/cm$^2$. The softening point was 97.6° C. The rubber-like material content of the grafted product (hereinafter referred to as "AAS") was 23.8% by weight.

AES Resin

A 20-liter autoclave made of stainless steel was charged with 5,350 g of styrene as a monomer, 1,500 g of an ethylene-propylene-diene terpolymer rubber (Mooney viscosity ML$_{1+4}$ (100° C.)): 45; unconjugated diene component: ethylidenenorbornene; iodine value: 25) as a rubber-like material, and 1.0 kg of n-heptane. After the air in the autoclave was replaced by nitrogen, the mixture was stirred at 50° C. for 2 hours to completely dissolve the ethylenepropylene-diene terpolymer rubber in styrene. To this reaction (polymerization) system was added 2,150 g of acrylonitrile as a monomer, and the resulting mixture was fully stirred to form a uniform solution. To the uniform solution were added 5.0 g of terepinolene and, as a catalyst, a mixture of 5.0 g of di-tert-butyl peroxide and 1.3 g of tert-butyl peracetate. The resulting polymerization system was raised in temperature to 97° C. Bulk polymerization was performed for 7 hours and 20 minutes at a nitrogen pressure of 1 kg/cm$^2$ while maintaining the temperature at 97° C. About 30 minutes before the completion of the polymerization, a solution of 15.0 g of di-tert-butyl peroxide and 15.0 g of terpinolene dissolved in 500 g of styrene was added to the reaction mixture. The thus-formed syrup (containing polymer) was transferred to a 30-liter autoclave in which 11 liters of water (containing 25 g of an acrylic acid-acrylic acid ester copolymer as a suspension) had been placed, and nitrogen was passed through the autoclave to displace the air. This aqueous suspension was subjected to suspension polymerization for 2 hours with vigorous stirring at 130° C. The reaction mixture was then raised in temperature to 150° C. and was subjected to stripping for 1 hour. The thus-obtained polymer (graft-blended product) was fully washed with water and dried at 100° C. There was thus obtained 9.28 kg of a grafted product (hereinafter referred to as "AES"). The rubber-like material content of this AES was 16.0% by weight. The Izod impact strength of the AES was 37.9 kg.cm/cm-notch, and its tensile strength was 350 kg/cm$^2$. The Vicat softening point was 98.0° C.

ACS Resin

A 20-liter autoclave was charged with 1,600 g of chlorinated polyethylene (Mooney viscosity: 76; chlorine content: 40.6% by weight; hereinafter referred to as "Cl-PE(a)"), 32.0 g of polyvinyl alcohol (degree of saponification: 95%), and about 8.0 liters of water (ion exchanged water), which were then vigorously stirred at room temperature (about 23° C.). To the thus-formed dispersion were added 4,560 g of styrene and 1,520 g of acrylonitrile as monomers, 320 g of fluid paraffin as a lubricant, 16.0 g of tert-butyl peracetate as a polymerization initiator, and 16.0 g of tert-dodecylmercaptan as a chain transfer agent. The air above the suspension of the reaction system was displaced by nitrogen gas, and the temperature was then raised to 105° C. While stirring at this temperature, polymerization was performed for 4 hours, and further, it was performed at 145° C. for 2 hours. The reaction system was allowed to cool to room temperature. The thus-obtained polymer (grafted product) was filtered off and fully washed with water. The grafted product was then dried at 50° C. under reduced pressure one day and night. The polymerization conversion (based on the monomers used in the polymerization) was 95.4%, and the product was in the form of slightly coarse powder. The rubber-like material content of the grafted product (hereinafter referred to as "ACS") was 20.3% by weight.

Mixtures (1) and (2)

2,6-Xylenol was subjected to polycondensation by an oxidative coupling method to produce poly(2,6-dimethylphenylene-1,4-ether) (inherent viscosity (as determined at 30° C. in chloroform; unit: dl/g): 0.53; hereinafter referred to as "PPO"). Then, 100 parts by weight of PPO, 25 parts by weight of a styrene monomer, 10 parts by weight of PS as prepared hereinbefore, and 2.1 parts by weight of di-tertbutyl peroxide were mixed in a Henschel mixer for 10 minutes and, thereafter, a styrene-grafted PPO mixture was produced by the use of a twin screw extruder (diameter: 30 mm; resin temperature: 270° C.). This mixture was designated as "Mixture (1)".

In the same manner as in the production of Mixture (1), 50 parts by weight of Mixture (1) and 50 parts by weight of PS were dry-blended. The thus-obtained mixture was melted and kneaded in an extruder (diameter: 40 mm; resin temperature: 260° C.) to produce a mixture (hereinafter referred to as "Mixture (2)").

Mixtures (3) to (5)

To 70 parts by weight of an acrylonitrile-styrene copolymer resin (acrylonitrile content: 23% by weight; hereinafter referred to as "AS") were added, as a rubber-like material, chlorinated polyethylene (chlorine content: 31.6% by weight; Mooney viscosity ($MS_{1+4}$): 78) as prepared by chlorinating an ethylene-butene-1 copolymer (molecular weight: about 250,000; density: 0.931 g/cm$^3$) in an aqueous suspension form, the same butadiene-styrene copolymer rubber (hereinafter referred to as "SBR") as used in the production of the MBS resin, and the same ethylene-propylene-diene terpolymer rubber as used in the production of the AES resin, all being used in an amount of 30 parts by weight, and melted and kneaded in a 60-liter Banbury mixer (resin temperature: 180° C.) to produce Mixtures (3), (4) and (5), respectively.

Vinyl Chloride-Based Resin (Homopolymer)

A vinyl chloride homopolymer (hereinafter referred to as "PVC (1)") having a degree of polymerization of about 820 and a vinyl chloride homopolymer (hereinafter referred to as "PVC (2)") having a degree of polymerization of about 1,100 were used.

Vinyl Chloride-Based Resin (Copolymer)

As a vinyl chloride copolymer, a vinyl chloridevinyl acetate copolymer (degree of polymerization: 810; vinyl acetate content: 15% by weight; hereinafter referred to as "PVC (3)") was used. CL Mixture (6)

As a vinyl chloride-based resin mixture, a mixture of 20 parts by weight of an acrylonitrile-butadiene-styrene terpolymer (acrylonitrile content: about 20% by weight; butadiene content: about 25% by weight; styrene content: about 55% by weight) and 100 parts by weight of PVC (1) was used. This mixture is designated as "Mixture (6)".

Mixture (7)

As another vinyl chloride-based resin mixture, a mixture of 20 parts by weight of an acrylonitrile-butadiene copolymer rubber (Mooney viscosity ($ML_{1+4}$, 100° C.): 64; acrylonitrile content: about 27% by weight) and 100 parts by weight of PVC (1) was used. This mixture is designated as "Mixture (7)".

Chlorinated Polyethylene

As chlorinated polyethylene were used (a) amorphous chlorinated polyethylene (chlorine content: 31.5% by weight; Mooney viscosity ($ML_{1+4}$): 108; hereinafter referred to as "CPE (a)") as prepared by chlorinating an ethylene-butene-1 copolymer (butene-1 content: 3.0% by weight; density: 0.950 g/ml; average molecular weight: about 200,000) in an aqueous suspension, (b) amorphous chlorinated polyethylene (chlorine content: 40.2% by weight; Mooney viscosity ($MS_{1+4}$): 55; hereinafter referred to as "CPE (b)") as prepared by chlorinating an ethylene-butene-1 copolymer (density: 0.921 g/cm$^3$; M.I.: 20 g/10 min.; number of alkyl groups per 1,000 carbon atoms of the main chain: 6; melting point: 120° C.) by an aqueous suspension method, and (c) crystalline chlorinated polyethylene (chlorine content: 30.8% by weight; polyethylene residual crystal content: 7.15% by weight; Mooney viscosity ($ML_{1+4}$): 110; hereinafter referred to as "CPE (c)") as prepared by chlorinating an ethylene-butene-1 copolymer (butene-1 content: 3.0% by weight; density: 0.940 g/cm$^3$; average molecular weight: about 100,000).

Polycarbonate Resin

As a polycarbonate resin, an intermediate density polycarbonate resin (density: about 1.2 g/cm$^3$; melt flow index: 15 g/10 min.; hereinafter referred to as "PC") as prepared using bisphenol as a major starting material was used.

Polyamide Resin

As polyamide resins, a polyamide resin (melt viscosity at 250° C.: 3,000 poises; density: 1.13 g/cm$^3$) as produced by ring-opening polymerization of ε-caprolactam, and a polyamide resin (melt viscosity at 280° C.: 1,500 poises) as produced by polycondensation of hexamethylenediamine and adipic acid were used. These polyamide resins are designated, respectively, as "Nylon 6" and "Nylon 66".

Rubber-Like Material

An acrylonitrile-butadiene rubber (acrylonitrile component content: 28% by weight; Mooney viscosity: 75; hereinafter referred to as "NBR") was used as a rubber-like material.

Plasticizer

Benzenesulfonic acid butylamide (hereinafter referred to as "BMB") was used as a plasticizer.

Aluminum Flake

Square flake-like aluminum (hereinafter referred to as "Al flake") having a cross-sectional area of 1 mm×1 mm and a thickness of 0.03 mm was used.

Aluminum Powder

Aluminum powder (hereinafter referred to as "Al powder") having a grain size of from 74 to 150 microns was used.

Aluminum Fiber

As an aluminum fiber, an aluminum fiber (hereinafter referred to as "Al fiber") having a length of about 6 mm and a diameter of 65 microns was used.

Electrically Conductive Carbon Black

Furnace black (produced by Cabot Corp., U.S.A. under the trade name of Vulcan XC-72; density: about 1.8 g/ml; surface area: 200 m$^2$/g; hereinafter referred to as "C.B.") having a mean grain size of about 30 microns was used.

Halogen-Containing Organic Compound

As a halogen-containing organic compound, decabromodiphenyl oxide (melting point: 304° C.; average particle size: 3 μm; bromine content: about 82% by weight; hereinafter referred to as "DBPO") was used.

Antimony Oxide

Antimony trioxide (melting point: 656° C.; average particle size: 0.5 μm; hereinafter referred to as "Sb$_2$O$_3$") having a density of 5.25 g/cm$^3$ was used as antimony oxide.

Hydrous Inorganic Substance

As hydrated inorganic substance was used finely pulverized magnesium silicate (density: 2.75 g/cm$^3$; specific surface area: 20 m$^2$/g; grain diameter: 0.32–6 microns; SiO$_2$ content: 62.5% by weight; MgO content: 30.6% by weight; H$_2$O content: 4.99% by weight; hereinafter referred to as "MgO SiO$_2$").

EXAMPLES 1 to 5 AND COMPARATIVE EXAMPLES 1 TO 3

Modified PE, Al flake, and C.B. were previously dry-blended in the proportions (% by volume) as shown in Table 1 in a Henschel mixer (volume ratio: 11%) for 5 minutes. The resulting mixture was pelletized while melting and kneading it in a twin-screw extruder (diameter: 30 mm) at a resin temperature of 0° C. to prepare the desired composition.

Figure 3:
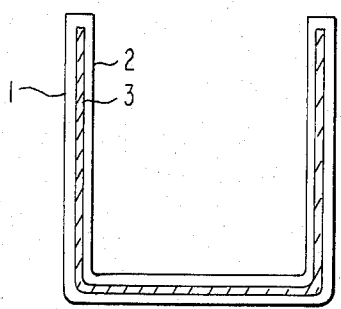
FIG. 3 is a cross-sectional view taken along the line A—A of FIG. 2, wherein the reference numerals 1 and 3 indicate an outer layer (surface layer), and 2, an inner layer (shielding layer).

A molded article (laminated product) as shown in FIG. 3 was produced by means of a multi-layer injection molding machine (preset temperature: 230° C.; molding pressure: 650 tons), which composed of, as shown in FIG. 3, a shielding layer 2 made of the above-produced pellets and surface layers 1 and 3 made of high density polyethylene (HDPE). This molded article was a rectangular box-like product having a depth of 100 mm, a width of 120 mm, and a length of 290 mm. Its cross section is shown in FIG. 3, in which the average thickness of each of the surface layers 1 and 3 was 1 mm, and the average thickness of the inner layer 2 was 3 mm. For the shielding layer of the molded product, the volume resistance and the electromagnetic wave attenuation ratio were measured. The results are shown in Table 1.

In all examples, the volume resistance of the surface layer was 10$^{16}$Ω-cm.

TABLE 1

|  | Proportions (% by volume) | | | Volume Resistance (Ω · cm) | Electromagnetic Wave Attenuation Amount (dB) |
| --- | --- | --- | --- | --- | --- |
|  | Modified PE | Al Flake | C.B. | | |
| Example | | | | | |
| 1 | 80 | 10 | 10 | 10$^2$ | 25 |
| 2 | 70 | 15 | 15 | 10$^2$ | 30 |
| 3 | 60 | 20 | 20 | 10$^1$ | 38 |
| 4 | 70 | 10 | 20 | 10$^1$ | 27 |
| 5 | 70 | 20 | 10 | 10$^2$ | 28 |
| Comparative Example | | | | | |
| 1 | 100 | 0 | 0 | 10$^{16}$ | 0 |
| 2 | 80 | 20 | 0 | 10$^6$ | 12 |
| 3 | 80 | 0 | 20 | 10$^2$ | 3 |

EXAMPLES 6 TO 14 AND COMPARATIVE EXAMPLES 4 TO 9

The same dry-blending procedure as in Example 1 was performed with the exception that modified PP (in the proportion as shown in Table 2) was used in place of the modified PE. The thus-prepared mixture was pelletized while melting and kneading at a resin temperature of 230° C. to prepare the desired composition.

Using the above-produced pellets in the preparation of the shielding layer (in place of the pellets as used in Example 1) and HIPP in the preparation of the surface layer (in place of the HDPE as used in Example 1), a molded article was produced by a multi-layer injection molding machine (preset temperature: 250° C.). For the shielding layer of the molded article, the volume resistance and the electromagnetic wave attenuation ratio were measured. The results are shown in Table 2.

In all examples, the volume resistance of the surface layer was 10$^{15}$Ω-cm.

TABLE 2

|  | Amount of Modified PP Added (% by volume) | Type | Amount (% by volume) | Amount of C.B. Added (% by volume) | Volume Resistance (≈ · cm) | Electromagnetic Wave Attenuation (dB) |
| --- | --- | --- | --- | --- | --- | --- |
| Example | | | | | | |
| 6 | 80 | Al flake | 10 | 10 | 10$^2$ | 26 |
| 7 | 70 | " | 15 | 15 | 10$^2$ | 32 |
| 8 | 60 | " | 25 | 15 | 10$^1$ | 35 |
| 9 | 75 | Al powder | 15 | 10 | 10$^2$ | 21 |
| 10 | 65 | " | 20 | 15 | 10$^1$ | 26 |
| 11 | 60 | " | 25 | 15 | 10$^1$ | 28 | duced in Examples 38 and 39, and Comparative Example 17 was $10^{14}\Omega\cdot cm$.

TABLE 5

| | Surface Layer | | | | Shielding Layer | | | | | | Amount of C.B. Compounded |
|---|---|---|---|---|---|---|---|---|---|---|---|
| | Component (A) | | Component (B) | | Component (1) | | Component (2) | | Al Component | | |
| | Type | Amount[1] | Type | Amount[1] | Type | Amount[1] | Type | Amount[1] | Type | Amount[1] | |
| Example | | | | | | | | | | | |
| 32 | PVC (1) | 90 | CPE (A) | 10 | PVC (1) | 80 | CPE (A) | 20 | Al flake | 10 | 10 |
| 33 | " | " | " | " | " | " | " | " | " | 15 | 15 |
| 34 | " | " | " | " | " | " | CPE (B) | " | Al fiber | 15 | 15 |
| 35 | " | " | " | " | " | " | CPE (C) | " | Al powder | 20 | 10 |
| 36 | PVC (2) | " | " | " | " | " | " | " | Al flake | 15 | 15 |
| 37 | PVC (3) | " | " | " | PVC (3) | " | CPE (A) | " | " | " | " |
| 38 | Mixture (7) | 100 | — | 0 | " | " | " | " | " | " | " |
| 39 | Mixture (6) | 80 | CPE (B) | 10 | " | " | " | " | " | " | " |
| Comparative Example | | | | | | | | | | | |
| 14 | PVC (1) | 90 | CPE (A) | " | PVC (1) | " | CPE (C) | " | " | 15 | 0 |
| 15 | " | " | " | " | " | " | " | " | — | 0 | 15 |
| 16 | " | " | " | " | " | " | " | " | Al powder | 20 | 0 |
| 17 | " | " | " | " | " | " | " | " | Al fiber | 15 | 0 |
| 18 | " | " | " | " | " | " | " | " | — | 0 | 0 |

Note:
[1] % by volume

TABLE 4-continued

| | Volume Resistance ($\Omega\cdot cm$) | | Transmission Attenuation Amount (dB) |
|---|---|---|---|
| | Surface Layer | Shielding Layer | |
| 30 | $10^{16}$ | $10^{1}$ | 29 |
| 31 | $10^{17}$ | $10^{1}$ | 29 |
| Comparative Example 10 | $10^{17}$ | $10^{5}$ | 6 |
| 11 | $10^{17}$ | $10^{2}$ | 10 |
| 12 | $10^{17}$ | $10^{4}$ | 5 |
| 13 | $10^{16}$ | $10^{3}$ | 4 |

EXAMPLES 32 TO 39 AND COMPARATIVE EXAMPLES 14 TO 18

Vinyl chloride-based resins (each containing, per 100 parts by weight of the vinyl chloride-based resin, 30 parts by weight of dioctyl phthalate and 25 parts by weight of dibenzyl phthalate as a plasticizer, and 3 parts by weight of tribasic lead sulfate and 1 part by weight of dibasic lead stearate as a stabilizer), chlorinated polyethylene, and the above-described Mixtures, Al flake, Al fiber and Al powder as the aluminum component, and C.B. were used and previously dry-blended in the proportions shown in Table 5 in a Henschel mixer for 5 minutes. The thus-prepared mixtures were each melted and kneaded at a resin temperature of 230° C. by the use of a twin-screw extruder (diameter: 30 mm), and extruded therefrom to produce the respective pellets.

A molded article was produced in the same manner as in Example 1 by the use of a multi-layer injection molding machine (preset temperature: 200° C.; molding pressure: 650 tons), in which the inner layer (shielding layer) 2 as shown in FIG. 3 was made of the above-produced pellets, and the outer layers (surface layers) 1 and 3 were made of the vinyl chloride-based resins.

For the shielding layer of each molded article, the volume resistance and the electromagnetic wave attenuation ratio were measured. The results are shown in Table 6. The volume resistance of the surface layer of each of the molded articles produced in Examples 32 to 37 and Comparative Examples 14 to 16 and 18 was $10^{15}\Omega\cdot cm$, and that of each of the molded articles pro-

TABLE 6-1

| | Volume Resistance of Shielding Layer ($\Omega\cdot cm$) | Transmission Attenuation Amount (dB) |
|---|---|---|
| Example 32 | $10^{2}$ | 25 |
| 33 | $10^{1}$ | 27 |
| 34 | $10^{1}$ | 26 |
| 35 | $10^{1}$ | 23 |
| 36 | $10^{1}$ | 26 |
| 37 | $10^{1}$ | 27 |
| 38 | $10^{1}$ | 27 |
| 39 | $10^{1}$ | 29 |

TABLE 6-2

| | Volume Resistance of Shielding Layer ($\Omega\cdot cm$) | Transmission Attenuation Amount (dB) |
|---|---|---|
| Comparative Example 14 | $10^{4}$ | 10 |
| 15 | $10^{3}$ | 7 |
| 16 | $10^{5}$ | 11 |
| 17 | $10^{4}$ | 5 |
| 18 | $10^{15}$ | 0 |

EXAMPLES 40 TO 46 AND COMPARATIVE EXAMPLES 19 TO 23

PC, PP, Al flake, Al fiber, Al powder, and C.B. were previously dry-blended in the proportions shown in Table 7 by means of a Henschel mixer for 5 minutes. The thus-prepared mixtures were each melted and kneaded at a resin temperature of 270° C. by the use of a twin-screw extruder (diameter: 30 mm) and pelletized to produce the desired composition.

A molded article (laminated product) as shown in FIG. 2 was produced by means of a multi-layer injection molding machine (preset temperature: 280° C.; molding pressure: 650 tons), in which the inner layer (shielding layer) 2 as shown in FIG. 3 was made of the TABLE 2-continued

|  | Amount of Modified PP Added (% by volume) | Type | Amount (% by volume) | Amount of C.B. Added (% by volume) | Volume Resistance ($\approx \cdot$ cm) | Electromagnetic Wave Attenuation (dB) |
|---|---|---|---|---|---|---|
| 12 | 80 | Al fiber | 10 | 10 | $10^3$ | 18 |
| 13 | 70 | " | 15 | 15 | $10^2$ | 22 |
| 14 | 65 | " | 20 | 15 | $10^2$ | 25 |
| Comparative Example | | | | | | |
| 4 | 80 | Al flake | 20 | 0 | $10^6$ | 15 |
| 5 | 80 | " | 3 | 17 | $10^2$ | 3 |
| 6 | 80 | Al powder | 20 | 0 | $10^8$ | 12 |
| 7 | 80 | " | 3 | 17 | $10^2$ | 3 |
| 8 | 80 | Al fiber | 20 | 0 | $10^5$ | 12 |
| 9 | 80 | " | 3 | 17 | $10^2$ | 4 |

EXAMPLES 13 TO 31 AND COMPARATIVE EXAMPLES 10 TO 13

PS, HIPS, ABS resin, MBS resin, AAS resin, AES resin, ACS resin, Mixtures (1) to (5), and SBR as styrene-based resins, Al flake, Al powder, and Al fiber as Al component, and C.B. as electrically conductive carbon black were used and previously dry-blended in the proportions shown in Table 3 in a Henschel mixer for 5 minutes. The thus-prepared mixtures were each melted and kneaded at a resin temperature of 230° C. in a twin-screw extruder (diameter: 30 mm) and extruded therefrom to produce the respective pellets.

A molded article was produced in the same manner as in Example 1 by the use of a multi-layer injection machine (preset temperature: 240° C.; molding pressure: 650 tons), in which the inner layer (shielding layer) 2 as shown in FIG. 3 was made of the above-produced pellets, and the outer layers (surface layers) 1 and 3 were made of styrene-based resins. For each of the shielding and surface layers of each molded article, the volume resistance and the electromagnetic attenuation ratio were measured. The results are shown in Table 4.

TABLE 3

| | Surface Layer | | | | Shielding Layer | | | | | | Amount of C.B. Compounded[1] |
|---|---|---|---|---|---|---|---|---|---|---|---|
| | Component (A) | | Component (B) | | Component (1) | | Component (2) | | Al Component | | |
| | Type | Amount[1] | Type | Amount[1] | Type | Amount[1] | Type | Amount[1] | Type | Amount[1] | |
| Example | | | | | | | | | | | |
| 15 | HIPS | 100 | — | — | HIPS | 60 | SBR | 20 | Al flake | 10 | 10 |
| 16 | PS | 80 | SBR | 20 | " | 50 | " | " | " | 15 | 15 |
| 17 | ABS | 80 | " | " | " | " | " | 10 | " | 20 | 20 |
| 18 | Mixture (1) | 100 | — | — | " | " | " | 20 | " | 10 | " |
| 19 | Mixture (2) | " | — | — | " | " | " | " | " | 20 | 10 |
| 20 | ACS | " | — | — | " | 60 | " | 10 | Al fiber | 15 | 15 |
| 21 | HIPS | 80 | MBS | 20 | " | 50 | " | 20 | Al powder | 20 | 10 |
| 22 | " | " | AAS | " | " | " | " | 10 | " | 30 | " |
| 23 | " | " | AES | " | PS | 50 | SBR | 20 | Al flake | 15 | 15 |
| 24 | Mixture (1) | " | PS | 20 | ABS | 60 | " | 10 | " | " | " |
| 25 | ABS | 100 | — | — | " | " | PS | " | " | " | " |
| 26 | ACS | " | — | — | ACS | " | " | " | " | " | " |
| 27 | Mixture (1) | " | — | — | Mixture (1) | 50 | " | 20 | " | " | " |
| 28 | Mixture (2) | " | — | — | Mixture (2) | " | " | " | " | " | " |
| 29 | Mixture (1) | 80 | PS | 20 | Mixture (1) | " | Mixture (3) | " | " | " | " |
| 30 | " | 60 | " | 40 | " | " | Mixture (4) | " | " | " | " |
| 31 | " | 40 | " | 60 | " | " | Mixture (5) | " | " | " | " |
| Comparative Example | | | | | | | | | | | |
| 10 | HIPS | 100 | — | — | HIPS | 60 | SBR | " | " | 20 | 0 |
| 11 | " | " | — | — | " | " | " | " | — | 0 | 20 |
| 12 | " | " | — | — | " | " | " | " | Al powder | 20 | 0 |
| 13 | Mixture (1) | " | — | — | " | " | " | " | Al fiber | " | 0 |

Note:
[1] % by volume

TABLE 4

| | Volume Resistance ($\Omega \cdot$ cm) | | Transmission Attenuation Amount (dB) |
|---|---|---|---|
| | Surface Layer | Shielding Layer | |
| Example 15 | $10^{17}$ | $10^2$ | 24 |
| 16 | $10^{17}$ | $10^1$ | 28 |
| 17 | $10^{16}$ | $10^0$ | 32 |
| 18 | $10^{16}$ | $10^0$ | 25 |
| 19 | $10^{16}$ | $10^1$ | 30 |
| 20 | $10^{16}$ | $10^1$ | 25 |
| 21 | $10^{16}$ | $10^1$ | 27 |
| 22 | $10^{16}$ | $10^0$ | 32 |
| 23 | $10^{16}$ | $10^1$ | 29 |
| 24 | $10^{16}$ | $10^1$ | 29 |
| 25 | $10^{16}$ | $10^1$ | 30 |
| 26 | $10^{16}$ | $10^1$ | 30 |
| 27 | $10^{17}$ | $10^1$ | 28 |
| 28 | $10^{17}$ | $10^1$ | 31 |
| 29 | $10^{16}$ | $10^1$ | 30 | above-prepared pellets, and the outer layers (surface layers) 1 and 3 were made of the above-described polycarbonate resin.

For the shielding layer of each of the above-produced molded articles, the volume resistance and the electromagnetic wave attenuation ratio were measured. The results are shown in Table 8. In all examples, the volume resistance of the surface layer of each of the molded articles was $10^{15}\Omega\cdot cm$.

TABLE 7

| | Surface Layer Proportions[1] | | Shielding Layer | | | | |
| | | | Proportions[1] | | Al Component | | Amount of C.B. |
| | P.C. | P.P. | P.C. | P.P | Type | Amount | Compounded |
| --- | --- | --- | --- | --- | --- | --- | --- |
| Example | | | | | | | |
| 40 | 100 | 0 | 100 | 0 | Al flake | 15 | 15 |
| 41 | " | " | " | " | " | 20 | 20 |
| 42 | " | " | " | " | Al fiber | 15 | 15 |
| 43 | " | " | " | " | Al powder | 20 | 10 |
| 44 | " | " | " | " | " | 30 | " |
| 45 | 90 | 10 | " | " | Al flake | 15 | 15 |
| 46 | 100 | 0 | 90 | 10 | " | " | " |
| Comparative Example | | | | | | | |
| 19 | " | " | 100 | 0 | " | " | 0 |
| 20 | " | " | " | " | " | 0 | 15 |
| 21 | " | " | " | " | Al fiber | 15 | 0 |
| 22 | " | " | " | " | Al powder | 20 | " |
| 23 | " | " | " | " | — | 0 | " |

Note:
[1] % by volume

TABLE 8

| | Volume Resistance of Shielding Layer ($\Omega\cdot cm$) | Transmission Attenuation Amount (dB) |
| --- | --- | --- |
| Example 40 | $10^0$ | 27 |
| 41 | $10^0$ | 43 |
| 42 | $10^0$ | 29 |
| 43 | $10^0$ | 28 |
| 44 | $10^0$ | 32 |
| 45 | $10^0$ | 31 |
| 46 | $10^0$ | 30 |
| Comparative Example 19 | $10^3$ | 13 |
| 20 | $10^2$ | 7 |
| 21 | $10^3$ | 10 |
| 22 | $10^3$ | 11 |
| 23 | $10^{15}$ | 0 |

EXAMPLES 47 TO 51 AND COMPARATIVE EXAMPLES 24 TO 28

Polyamide resins, rubber-like material, a plasticizer, Al flake, Al fiber, Al powder, and C.B. were previously dry-blended in the proportions (volume ratio) shown in Table 9 by the use of a Henschel mixer for 5 minutes. Each mixture thus-prepared was pelletized while melting and kneading at a resin temperature of 260° C. by means of a twin-screw extruder (diameter: 30 mm) to produce the desired composition.

A molded article (laminated product) as shown in FIG. 2 was produced by means of a multi-layer injection molding machine (preset temperature: 270° C.; molding pressure: 650 tons), in which the inner layer (shielding layer) 2 as shown in FIG. 3 was made of the above-produced pellets, and the outer layers (surface layers) 1 and 3 were made of the above-prepared polyamide resins or their mixtures (proportion: by volume).

The volume resistance and the electromagnetic wave attenuation ratio of each of the surface and shielding layers of the molded article were measured. The results are shown in Table 10.

TABLE 9

| | Surface Layer | | | Shielding Layer | | | | | |
| | Polyamide Resin | | Amount | Polyamide Resin | | Amount | Al Component | | Amount of C.B. |
| | Type | Amount | of NBR | Type | Amount | of BMB | Type | Amount | Compounded |
| --- | --- | --- | --- | --- | --- | --- | --- | --- | --- |
| Example | | | | | | | | | |
| 47 | Nylon 6 | 100 | 0 | Nylon 6 | 60 | 10 | Al flake | 15 | 15 |
| 48 | " | 90 | 10 | " | 50 | " | " | 20 | 20 |
| 49 | " | 100 | 0 | " | 60 | " | Al fiber | 15 | 15 |
| 50 | " | " | " | " | " | " | Al powder | 20 | 10 |
| 51 | Nylon 66 | " | " | Nylon 66 | " | " | Al flake | 15 | 15 |
| Comparative Example | | | | | | | | | |
| 24 | Nylon 6 | " | " | Nylon 6 | 85 | 0 | " | " | 0 |
| 25 | " | " | " | " | " | 0 | — | 0 | 15 |
| 26 | " | " | " | " | 70 | 10 | Al powder | 20 | 0 |
| 27 | " | " | " | " | 85 | 0 | Al fiber | 15 | 0 |
| 28 | " | " | " | " | 100 | 0 | — | 0 | 0 |

TABLE 10

| | Volume Resistance ($\Omega\cdot cm$) | | Transmission Attenuation Amount (dB) |
| | Surface Layer | Shielding Layer | |
| --- | --- | --- | --- |
| Example 47 | $10^{14}$ | $10^1$ | 31 |
| 48 | $10^{15}$ | $10^0$ | 40 |
| 49 | $10^{14}$ | $10^1$ | 30 |
| 50 | $10^{14}$ | $10^1$ | 28 |
| 51 | $10^{15}$ | $10^1$ | 29 |
| Comparative Example 24 | $10^{14}$ | $10^3$ | 17 |

TABLE 10-continued

| | Volume Resistance ($\Omega \cdot cm$) | | Transmission Attenuation Amount (dB) |
|---|---|---|---|
| | Surface Layer | Shielding Layer | |
| 25 | $10^{14}$ | $10^3$ | 12 |
| 26 | $10^{14}$ | $10^4$ | 15 |
| 27 | $10^{14}$ | $10^4$ | 10 |
| 28 | $10^{14}$ | $10^{14}$ | 0 |

EXAMPLES 52 TO 74 AND COMPARATIVE EXAMPLES 29 to 30

Molded articles as shown in FIG. 2 were produced by means of a multi-layer injection molding machine (preset temperature; the same temperature as that corresponding to the respective resin), in which the surface layer and the shielding layer were made of the resins shown in Table 11 (as produced in Examples 1 to 51 and Comparative Examples 1 to 28).

In connection with the EEA used in Examples 63 to 65, a mixture of 20% by volume of aluminum flake, 30% by volume of C.B., and 50% by volume of EEA was melted and kneaded under the same conditions as in Example 1, and pelletized to produce the desired composition.

In connection with the flame retardant EEA used in Examples 72 to 74, a mixture consisting of 100 parts by weight of the above-described composition EEA, 10 parts by weight of DBPO, 4 parts by weight of $Sb_2O_3$, and 10 parts by weight of $MgO.SiO_2$ was melted and kneaded under the same conditions as in Example 1, and pelletized to produce the desired composition.

In connection with the flame retardant PP used in Examples 68 to 71, a mixture consisting of 100 parts by weight of the modified PP used in Example 8, 8 parts by weight of DBPO, 10 parts by weight of $Sb_2O_3$, and 15 parts by weight of $MgO.SiO_2$ was melted and kneaded under the same conditions as in Example 8, and pelletized to produce the desired composition.

The flame retardant EEA and PP compositions had a flame retardance of UL-94, V-O ($\frac{1}{8}$inch thickness).

For each molded article, the electromagnetic wave attenuation ratio and the volume resistance of the shielding layer were measured. The results are shown in Table 12. The volume resistance of the surface layer was within the range of from $10^{14}$ to $10^{16}$ $\Omega.cm$.

TABLE 11

| | Surface Layer | | Shielding Layer | |
|---|---|---|---|---|
| | Resin | Resin Produced in Example | Resin | Resin Produced in Example |
| Example | | | | |
| 52 | HIPS | 15 | Modified PP | 7 |
| 53 | PS-based Mixture (1) | 18 | " | " |
| 54 | PS-based Mixture (2) | 19 | " | " |
| 55 | ABS | 17 | " | " |
| 56 | Nylon 6 | 17 | " | " |
| 57 | ACS | 20 | " | " |
| 58 | Modified PP | 6 | PS | 16 |
| 59 | PS-based Mixture (1) | 18 | " | " |
| 60 | PS-based Mixture (2) | 19 | " | " |
| 61 | ABS | 17 | " | " |
| 62 | ACS | 20 | " | " |
| 63 | PS-based Mixture (1) | 18 | EEA | — |
| 64 | HIPS | 15 | " | — |
| 65 | Modified PP | 6 | " | — |
| 66 | Nylon 6 | 47 | PC | 40 |
| 67 | PC | 40 | Nylon 6 | 47 |
| 68 | PS-based Mixture (1) | 18 | Flame-retardant PP | — |
| 69 | HIPS | 15 | " | — |
| 70 | ACS | 20 | " | — |
| 71 | PVC(1) | 32 | " | — |
| 72 | PS-based Mixture (1) | 18 | Flame-retardent EEA | — |
| 73 | ACS | 20 | " | — |
| 74 | Modified PP | 6 | " | — |
| Comparative Example | | | | |
| 29 | Nylon 6 | 47 | HIPS | 16 |
| 30 | Nylon 6 | 47 | HDPE | 2 |

TABLE 12

| | Volume Resistance ($\Omega \cdot cm$) | Transmission Attenuation Amount (dB) |
|---|---|---|
| Example 52 | $10^1$ | 32 |
| 53 | $10^1$ | 31 |
| 54 | $10^1$ | 32 |
| 55 | $10^1$ | 30 |
| 56 | $10^1$ | 31 |
| 57 | $10^1$ | 31 |
| 58 | $10^1$ | 30 |
| 59 | $10^1$ | 28 |
| 60 | $10^1$ | 28 |
| 61 | $10^1$ | 30 |
| 62 | $10^1$ | 30 |
| 63 | $10^1$ | 27 |
| 64 | $10^1$ | 27 |
| 65 | $10^1$ | 28 |
| 66 | $10^1$ | 30 |
| 67 | $10^1$ | 32 |
| 68 | $10^1$ | 28 |
| 69 | $10^1$ | 28 |
| 70 | $10^1$ | 27 |
| 71 | $10^1$ | 27 |
| 72 | $10^1$ | 26 |
| 73 | $10^1$ | 25 |
| 74 | $10^1$ | 26 |
| Comparative Example 29 | $10^0$ | 33 |
| 30 | $10^0$ | 32 |

A housing (length: 100 mm; width: 260 mm; depth: 370 mm) for a printer was produced by the use of the same multi-layer injection molding machine as used in Example 1 under the same conditions as in Examples 7, 18, 40 and 47, and Comparative Examples 5, 13, 23, and 28.

Figure 4:
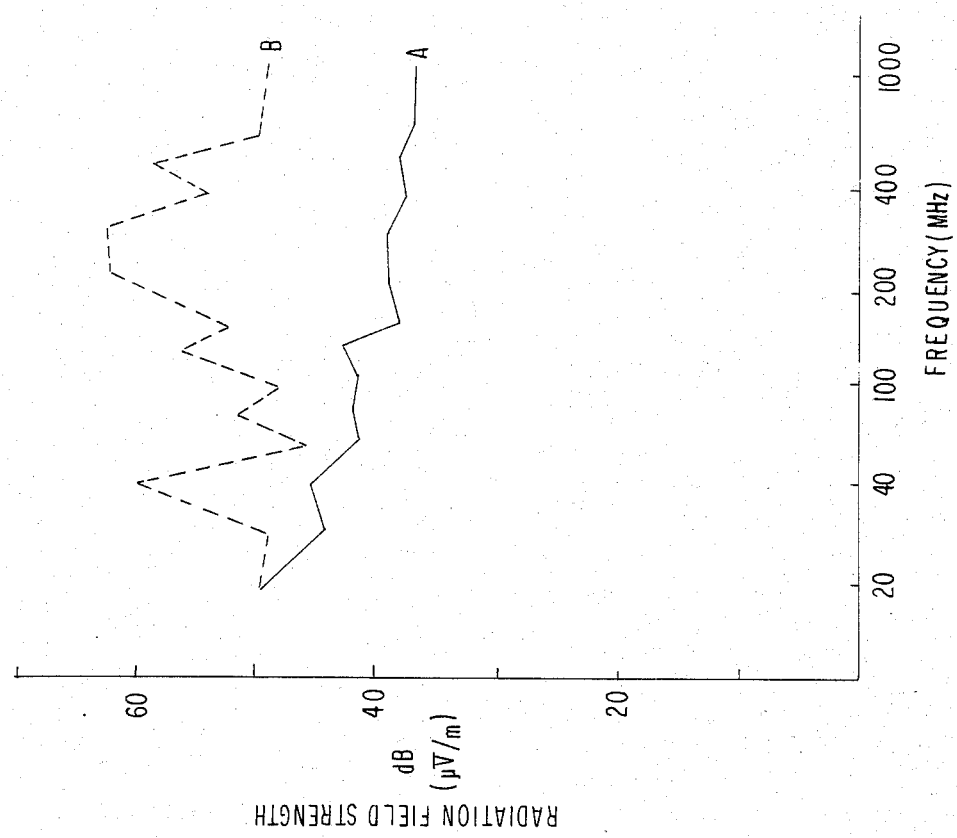
FIG. 4 shows the radiation field strength of each of the printer housings produced in Example 7 and Comparative Example 5.
Figure 5:
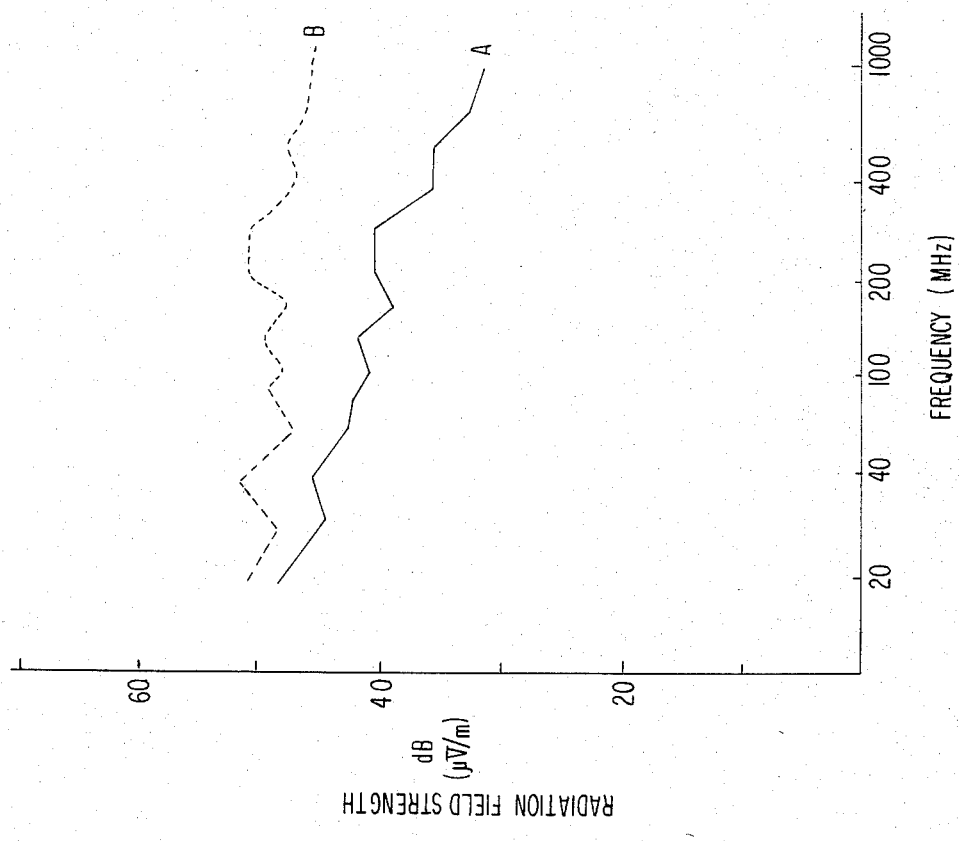
FIG. 5 shows the radiation field strength of each of the printer housing produced in Examples 18 and Comparative Example 13.
Figure 6:
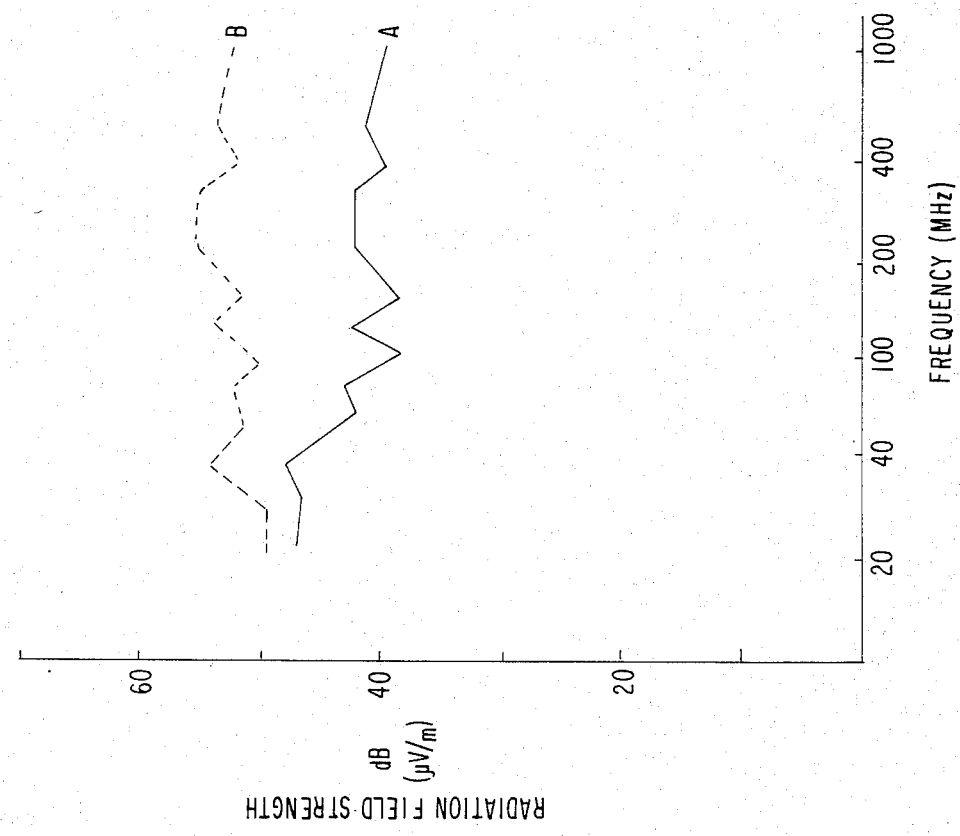
FIG. 6 shows the radiation field strength of each of the printer housings produced in Examples 40 and Comparative Example 23.
Figure 7:
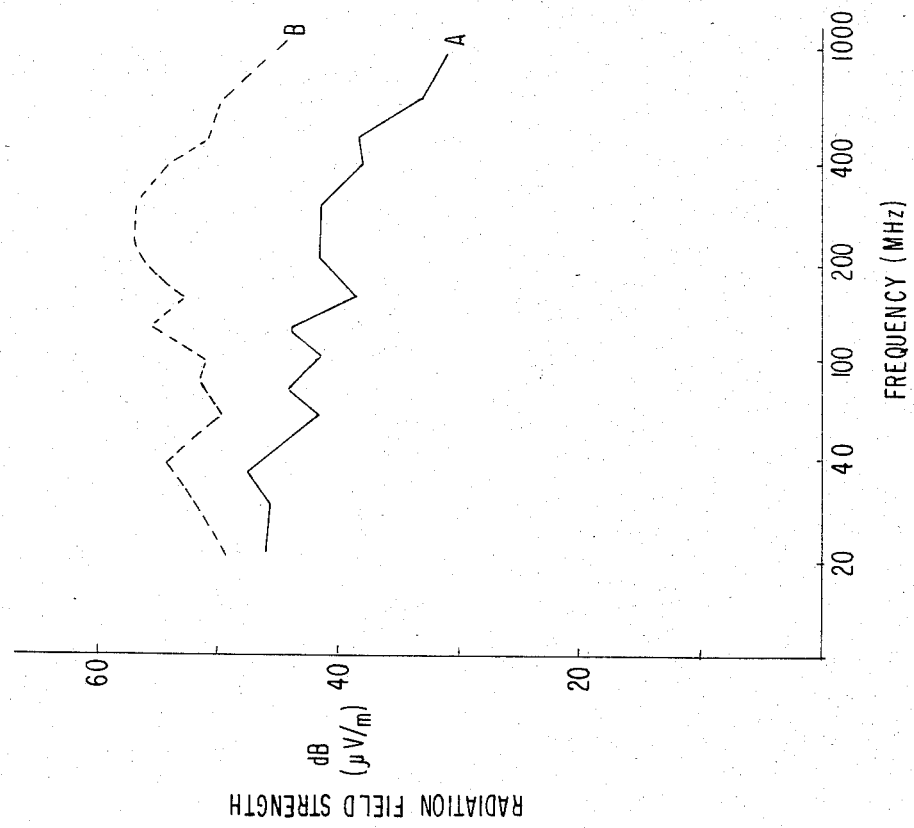
FIG. 7 shows the radiation field strength of each of the printer housings produced in Example 47 and Comparative Example 28.

The radiation field strength of the printer housing was measured according to the radiation radio noise testing method as prescribed in FCC (Federal Communication Committee), Document No. 20780 over a radiation frequency range of from 30 to 1,000 MHz. The distance between the sample and the antenna was set at 3 m. The results are shown in FIG. 4 (Example 7 and Comparative Example 5), FIG. 5 (Example 18 and Comparative Example 13), FIG. 6 (Example 40 and Comparative Example 23), and FIG. 7 (Example 47 and Comparative Example 28). In these figures, A (solid line) indicates the results for the printer housing as produced in the Examples and B (dotted line), the results for the printer housing as produced in the Comparative Examples. As apparent from the figures, the field strength in each Example (A) is small over a high frequency region (MHz region) compared with that in each Comparative Example (B). Therefore, it can be seen that the electromagnetic wave-shielding material of the invention has improved electromagnetic wave-shielding properties.

For the molded articles (as shown in FIG. 2) produced in Examples 2, 7, 15, 18, 26, 40, 47, and 52 to 74, and Comparative Examples 1, 5, 10, 22, 26, 29, and 30, the appearance, the state that the outer layer was separated from the shielding layer by a heating-cooling cycle (as determined by the degree of swelling of the surface layer), and the impact resistance were measured.

In connection with the heating-cooling cycle, the molded article was allowed to stand at 0° C. for 2 hours, and then, at 60° C. for 2 hours. This process was reversably repeated five times. Thereafter, the appearance of the molded article was examined at room temperature. The impact resistance was measured according to UL-114, safety specification 53.24—i.e., a steel ball having a weight of 1.18 pounds and a diameter of 2 inches was allowed to drop on the surface of a test specimen (the back surface of the bottom of the box shown in FIG. 2) from a height of 1.3 m, and the state in which the surface was cracked or broken down was examined.

In the molded articles produced in the above-described Examples and Comparative Examples except for Comparative Examples 29 and 30, the appearance remained unchanged—i.e., no swelling occurred; even after the heating-cooling cycle test, neither swelling nor cracking occurred; and even after the measurement of the impact strength, there was observed neither cracking nor breakdown in the obverse and reverse sides.

From the above-described results, it can be seen that the surface layer has the function of insulating electricity and the shielding layer has an electromagnetic wave-shielding ability, and furthermore, that there can be obtained a molded article having excellent heating-cooling cycle properties and impact resistance.

In Comparative Examples 28 and 29, on the other hand, when the heating-cooling cycle test was performed after the measurement of the impact strength, there was observed that swelling of the surface layer at a point where the steel ball dropped and in the vicinity of the gate. This is considered to indicate that since the difference in the SP value between the surface layer and the shielding layer is seriously large, the compatibility between the two layers is poor, and, therefore, partial separation or stripping occurred at the time of impact, causing the swelling during the heating-cooling cycle process.

While the invention has been described in detail and with reference to specific embodiment thereof, it will be apparent to one skilled in the art that various changes and modifications can be made therein without departing from the spirit and scope thereof.

What is claimed is:

1. An electromagnetic wave-shielding material comprising:
   (1) an electromagnetic wave-shielding layer comprised of:
      (A) a thermoplastic resin;
      (B) an aluminum or aluminum alloy; and
      (C) electrically conductive carbon black; and
   (2) a surface layer comprised of a thermoplastic resin, wherein:
      (a) the thermoplastic resin (A) is selected from the group consisting of:
         (i) polyolefins modified with unsaturated carboxylic acids or derivatives of unsaturated carboxylic acids;
         (ii) copolymers of ethylene and unsaturated carboxylic acids and/or anhydrides thereof;
         (iii) copolymers of ethylene and an alkyl acrylate and/or an alkyl methacrylate;
         (iv) styrene-based resins;
         (v) vinyl chloride-based resins;
         (vi) polyamide resins;
         (vii) polycarbonate resins; and
         (viii) polyolefins,
      (b) the aluminum or aluminum alloy is in the form of: (i) particles having a mean size of 250 to 20 mesh; (ii) a fiberous aluminum or a fiberous aluminum alloy having a diameter of from 0.002 to 0.05 mm and a length of 10 mm or less; or (iii) a flake having a surface area of from $0.1 \times 0.1$ mm to $5 \times 5$ mm,
      (c) the electrically conductive carbon black has a specific surface area of from 20 to 1,800 $m^2/g$, and
      (d) the proportions of the electrically conductive carbon black and the aluminum or aluminum alloy in the electromagnetic wave-shielding layer are from 5 to 50% by volume, respectively, provided that the total proportion of the carbon black and the aluminum or aluminum alloy is from 10 to 60% by volume, and the difference in solubility parameter between the thermoplastic resin of the surface layer and the thermoplastic resin (A) of the electromagnetic wave-shielding layer is 3.0 or less.

2. An electromagnetic wave-shielding material as claimed in claim 1, wherein the thermoplastic resin (A) is selected from the group consisting of:
   (i) polyolefins modified with unsaturated carboxylic acids or derivatives of unsaturated carboxylic acids;
   (ii) copolymers of ethylene and unsaturated carboxylic acids and/or anhydrides thereof;
   (iii) copolymers of ethylene and an alkyl acrylate and/or an alkyl methacrylate;
   (iv) vinyl chloride-based resins;
   (v) polyamide resins; and
   (vi) polycarbonate resins.

3. An electromagnetic wave-shielding material as claimed in claim 1, wherein the aluminum alloy has an aluminum content of 80% by weight or more.

4. An electromagnetic wave-shielding material as claimed in claim 1, wherein the aluminum or aluminum alloy is in the form of a flake.

5. An electromagnetic wave-shielding material as claimed in claim 1, wherein the carbon black has a specific surface area of from 200 to 1200 m$^2$/g.

6. An electromagnetic wave-shielding material as claimed in claim 1, wherein the difference in the solubility parameter between the thermoplastic resin in the surface layer and the thermoplastic resin in the electromagnetic wave-shielding layer is 2.7 or less.

7. An electromagnetic wave-shielding material as claimed in claim 6, wherein the difference in the solubility parameter between the thermoplastic resin in the surface layer and the thermoplastic resin in the electromagnetic wave-shielding layer is 2.5 or less.

8. An electromagnetic wave-shielding material as claimed in claim 1, wherein the material is comprised of the electromagnetic wave-shielding layer sandwiched with the surface layers.

9. An electromagnetic wave-shielding material as claimed in claim 1, wherein said unsaturated carboxylic acids or derivatives of unsaturated carboxylic acids are monobasic carboxylic acids having at most 10 carbon atoms and at least one double bond, dibasic carboxylic acids having at most 15 carbon atoms and at least one double bond, or anhydrides of said dibasic carboxylic acids.

10. An electromagnetic wave-shielding material as claimed in claim 9, wherein said unsaturated carboxylic acids or derivatives of unsaturated carboxylic acids are maleic acid or maleic anhydride.

11. An electromagnetic wave-shielding material as claimed in claim 1, wherein said thermoplastic resin (A) is a polyolefin modified with unsaturated carboxylic acids or derivatives of unsaturated carboxylic acids and the thermoplastic resin of the surface layer is selected from the group consisting of:
(i) polyolefins,
(ii) styrene-based resins
(iii) polyamide resins;
(iv) polycarbonate resins, and
(v) mixtures thereof.

12. An electromagnetic wave-shielding material is claimed in claim 11, wherein said thermoplastic resin (A) is a polyolefin modified with unsaturated carboxylic acids or derivatives of unsaturated carboxylic acids and said thermoplastic resin of the surface layer is polyolefins.

* * * * *